(12) United States Patent
Finot et al.

(10) Patent No.: US 8,083,362 B2
(45) Date of Patent: Dec. 27, 2011

(54) THIN FILM REFLECTIVE COATING PINNING ARRANGEMENT

(75) Inventors: Marc A. Finot, Palo Alto, CA (US); Harold D. Ackler, Sunnyvale, CA (US)

(73) Assignee: Skyline Solar, Inc., Mountain View, CA (US)

( * ) Notice: Subject to any disclaimer, the term of this patent is extended or adjusted under 35 U.S.C. 154(b) by 0 days.

(21) Appl. No.: 13/096,951

(22) Filed: Apr. 28, 2011

(65) Prior Publication Data

US 2011/0259422 A1  Oct. 27, 2011

Related U.S. Application Data

(60) Provisional application No. 61/329,482, filed on Apr. 29, 2010.

(51) Int. Cl.
*B32B 7/14* (2006.01)
*B32B 7/10* (2006.01)
*F24J 2/18* (2006.01)

(52) U.S. Cl. ......... 359/883; 428/198; 428/223; 126/696

(58) Field of Classification Search ............... 428/195.1, 428/198, 214, 223; 359/883; 126/969
See application file for complete search history.

(56) References Cited

U.S. PATENT DOCUMENTS

| | | | |
|---|---|---|---|
| 4,229,077 A * | 10/1980 | Schwab | 359/846 |
| 4,337,997 A | 7/1982 | Sadoune et al. | |
| 5,242,873 A | 9/1993 | Singh et al. | |
| 5,304,418 A * | 4/1994 | Akada et al. | 428/345 |
| 5,405,676 A * | 4/1995 | Nakama | 428/198 |
| 5,756,186 A * | 5/1998 | Lievens et al. | 428/195.1 |
| 5,837,354 A * | 11/1998 | Ogisu et al. | 428/208 |
| 6,020,639 A | 2/2000 | Ulrich et al. | |
| 6,065,843 A * | 5/2000 | Martinez, Sr. | 359/847 |
| 6,455,138 B1 * | 9/2002 | Murano | 428/201 |
| 6,787,460 B2 | 9/2004 | Lee et al. | |
| 6,884,718 B2 | 4/2005 | Basceri | |
| 7,189,460 B2 | 3/2007 | Shin et al. | |
| 7,256,148 B2 | 8/2007 | Kastenmeier et al. | |
| 7,294,931 B2 | 11/2007 | Barns | |
| 7,517,603 B2 | 4/2009 | Schaevitz et al. | |
| 7,666,497 B2 * | 2/2010 | Takatsuki et al. | 428/337 |
| 7,968,479 B2 * | 6/2011 | Welch et al. | 442/328 |
| 2002/0090516 A1 | 7/2002 | Lashak et al. | |
| 2003/0203650 A1 | 10/2003 | Robbins | |
| 2004/0192037 A1 | 9/2004 | Barns | |
| 2004/0195606 A1 | 10/2004 | Basceri | |
| 2005/0153547 A1 | 7/2005 | Barns | |
| 2006/0258177 A1 | 11/2006 | Kastenmeier et al. | |

(Continued)

FOREIGN PATENT DOCUMENTS

JP  04084713 A  *  3/1992
WO  WO 0243177  5/2002

*Primary Examiner* — Mark Consilvio
(74) *Attorney, Agent, or Firm* — Beyer Law Group LLP

(57) ABSTRACT

In one aspect of the present invention, a reflector for use in a solar collector will be described. The reflector includes a thin film reflective coating that is positioned on a layer. For example, the layer may be a substrate that physically supports the reflective coating or a protective layer. There are multiple spaced apart pinning regions that are distributed through an interface between the layer and the thin film reflective coating. The pinning regions locally anchor the reflective coating to the layer. Some aspects of the present invention relate to the use of pinning regions in other types of optical or electrical components.

20 Claims, 12 Drawing Sheets

U.S. PATENT DOCUMENTS

| | | | |
|---|---|---|---|
| 2007/0223121 A1* | 9/2007 | Franck et al. | 359/883 |
| 2010/0048406 A1 | 2/2010 | Rupich et al. | |
| 2010/0132775 A1 | 6/2010 | Le et al. | |
| 2010/0143677 A1 | 6/2010 | Lee et al. | |
| 2010/0258185 A1 | 10/2010 | Meyer et al. | |
| 2010/0283131 A1 | 11/2010 | Chandrasekaren | |

* cited by examiner

Fig. 2C          Fig. 2D

THIN FILM REFLECTIVE COATING PINNING ARRANGEMENT

CROSS-REFERENCE TO RELATED APPLICATIONS

This application claims priority to U.S. Provisional Patent Application No. 61/329,482, filed Apr. 29, 2010, entitled "Reflective Coating," which is incorporated herein in its entirety for all purposes.

FIELD OF THE INVENTION

The present invention relates generally to the use of pinning regions to help adhere a thin film layer of an optical or electrical device to an adjacent layer or substrate. One particular application relates to the use of pinning regions in the reflector of a concentrating solar energy collector to help adhere a thin film reflective layer to a supporting surface. In other applications, similar pinning regions may be used in other types of optical or electrical components such as photovoltaic cells, mirrors, reflectors, windows, etc.

BACKGROUND OF THE INVENTION

Typically, the most expensive component of a photovoltaic (PV) solar collection system is the photovoltaic cell. To help conserve photovoltaic material, various concentrating photovoltaic (CPV) systems use reflectors to concentrate solar radiation on a smaller cell area. Since the material used to make reflectors is less expensive than the material used to make the cells, CPV systems are thought to be more cost-effective than conventional PV systems. Although existing designs work well, there are continuing efforts to improve the efficiency and reliability of reflectors and other components of solar energy collection systems.

Ideally, the reflectors used in a concentrating photovoltaic system should have high quality optical surfaces. In some concentrating photovoltaic systems a problem that is observed in practice stems from degradation of the reflective surface over time, which has the effect of reducing collection efficiency. One cause of surface degradation stems from the cracks, blisters, and delamination that can occur in or near the reflective surface. More specifically, layers of the reflector may begin to buckle or delaminate over time due to temperature cycling, moisture, wind and other environmental stresses. Such physical deformation of the reflector can scatter and absorb incident light and reduce the power output of the solar energy collection system. An object of the present invention is to provide mechanisms to help reduce such reflector degradation.

SUMMARY OF THE INVENTION

The present invention relates to the use of pinning regions to strengthen the adhesive bond between different layers of the reflector such that the likelihood of cracking or delamination is significantly reduced.

In one aspect of the present invention, a reflector for use in a solar collector is described. The reflector includes a thin film reflective coating that is adhered to a layer. By way of example, the layer may be a substrate that physically supports the reflective coating or a protective layer. There are multiple spaced apart pinning regions that are distributed through an interface between the layer and the thin film reflective coating. The pinning regions, which are made of an adhesive material, locally anchor the reflective coating to the layer.

The pinning regions can be arranged in a wide variety of ways. Some designs involve pinning regions that are defined by protrusions or pinning elements that extend out of the layer or one of the thin film layers. Such pinning elements may be integral with and made of the same materials as the substrate or the protective layer. In other embodiments, the pinning elements are made of different materials (e.g., titanium, chrome, glass, polymer, nickel, a metal alloy, etc.) Generally, the pinning regions cover only a fraction of the overall surface area of the reflector and thus do not substantially reduce the amount of incident sunlight that is reflected. In some embodiments, the pinning regions cover less than 5% or 1% of the surface area of the reflector.

In another aspect of the present invention, a photovoltaic cell for use in a solar collector will be described. The photovoltaic cell includes a semiconductor substrate whose surface is covered with two additional thin film layers. The two layers are made of different electrically conductive materials. There are spaced apart pinning regions at the interface between the two layers that help to locally anchor the layers. In some embodiments, the semiconductor substrate is made of silicon and one of the thin film layers is made of silver.

Pinning regions may be utilized in a wide variety of multilayered components, including reflectors, photovoltaic cells and windows. In another aspect of the present invention, an optical or electrical component with pinning regions will be described. The component includes a substrate and a thin film coating that is in direct contact with the surface of the substrate. Multiple spaced apart pinning regions are distributed through an interface between the substrate and the thin film coating. The pinning regions locally anchor the substrate to the coating. Generally, the interface between the substrate and the thin film coating is arranged to transmit or reflect optical, electrical and/or electromagnetic energy.

BRIEF DESCRIPTION OF THE DRAWINGS

The invention and the advantages thereof, may best be understood by reference to the following description taken in conjunction with the accompanying drawings in which:

FIGS. 2C and 2D are diagrammatic top views of portions of the reflector illustrated in FIG. 2A according to various embodiments of the present invention.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

In some concentrating photovoltaic systems, a reflector is used to reflect incident light towards a solar receiver. Ideally, the reflector has a high quality optical surface. If the reflector surface is degraded, the incident light may be absorbed or scattered and never reach the solar receiver.

In operation, the reflector is exposed to the ambient environment and various environmental stresses, such as temperature fluctuation, ultraviolet light exposure, and moisture. These stresses can cause portions of the reflector to blister or crack. As a result, the light may be scattered or absorbed.

Figure 1A:
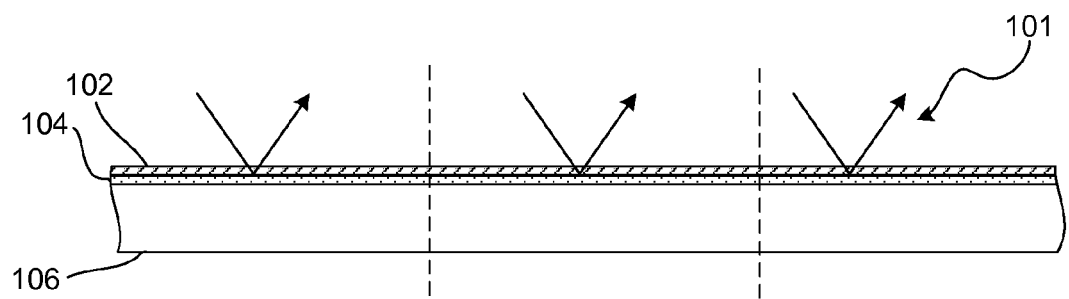
FIGS. 1A-1C are diagrammatic side views of an example reflector that is undergoing various types of buckling.
Figure 1B:
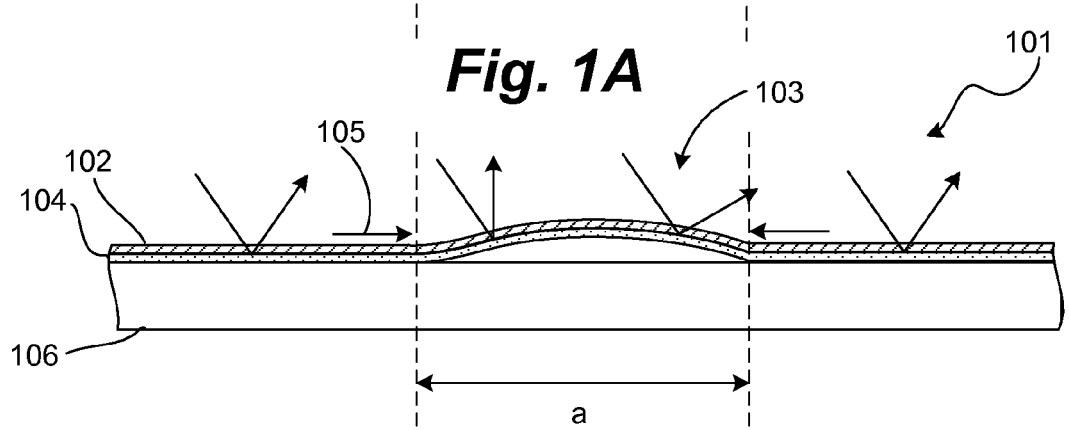
Figure 1C:
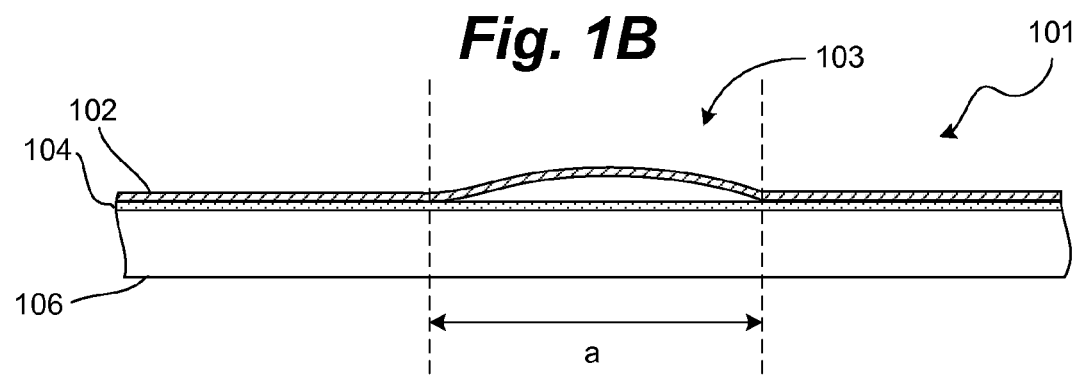

An example of this problem is diagrammatically illustrated in FIGS. 1A-1C. For purposes of comparison, FIG. 1A illustrates an example of an undamaged reflector 101. The reflector 101 includes a substrate 106, a reflective coating 104 and a protective layer 102. The protective layer 102, which is typically made of an optically transparent material, is formed over the other layers and helps shield them from environmental stresses. The reflective coating 104 is made of a highly reflective substance, such as aluminum or silver, and is arranged to redirect incident sunlight. The substrate 106, which may be made of glass, metal and/or another suitable material, provides structural support for the overlying layers. In this example, all of the layers are perfectly aligned with one another and no degradation has taken place.

FIGS. 1B and 1C illustrate situations in which there is buckling in one or more of the thin layers of the reflector 101. In FIG. 1B, both the reflective coating 104 and the protective layer 102 have separated from the underlying substrate 106 to form a void within the reflector 101. In FIG. 1C, the protective layer 102 has lifted off from the underlying reflective coating 104. In both figures, the deformation in the surface of the reflector forms a buckling feature 103. As a result, light is reflected in an unintended and undesirable direction, as indicated by the arrows in FIG. 1B.

There are several possible causes for such buckling. For example, moisture or other contaminants may have penetrated the reflector and weakened the bonds between some of its layers. There may be a mismatch in the coefficients of thermal expansion of the different layers. The reflector can also be damaged while being manufactured, transported or operated.

The different materials used to form the layers of the reflector can also affect the likelihood of delamination. For example, silver has excellent reflective properties and thus is highly suitable for use in the reflective coating 104. However, silver adheres poorly to many types of glass, metal and polymer. That is, silver unfortunately bonds poorly with many of the materials that the protective layer 102 and the substrate 106 would be made of. Although other metals, such as aluminum, can be used for the reflective coating and would adhere better to the other layers of the reflector, they may not reflect light as effectively as silver. This creates an undesirable trade-off between reflectivity and resiliency.

Figure 2A:
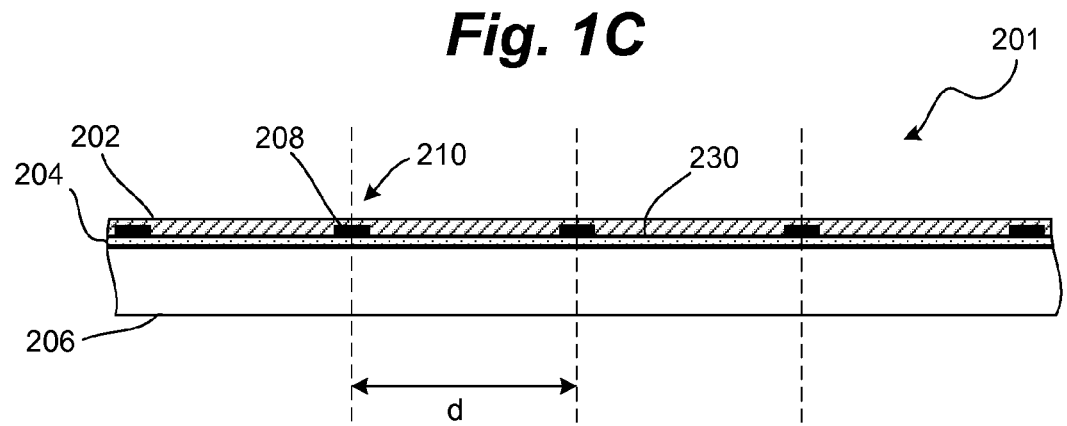
FIG. 2A is a diagrammatic side view of a reflector according to a particular embodiment of the present invention.
Figure 2B:
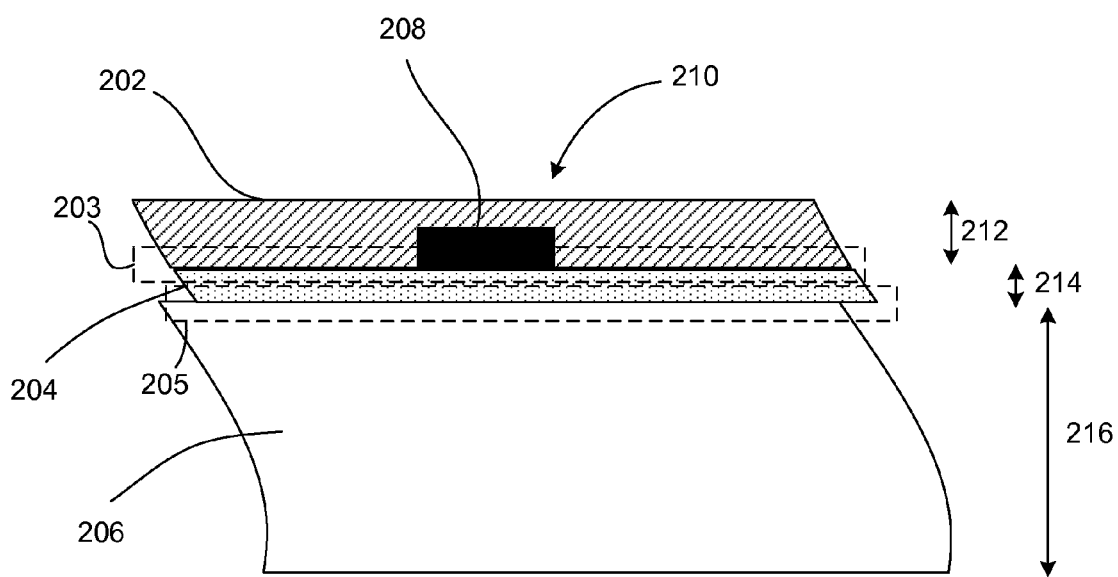
FIG. 2B is an enlarged view of a portion of the reflector illustrated in FIG. 2A.

Various embodiments of the present invention address one or more of the above issues. One of these embodiments is illustrated in FIGS. 2A-2C. FIG. 2A is a diagrammatic side view of a reflector 201 that includes a thin film protective layer 202, a thin film reflective coating 204, a substrate 206 and various spaced apart pinning regions 210. (FIGS. 2B and 2C are, respectively, a magnified side view and a top view of portions of the reflector 201 illustrated in FIG. 2A.) In the illustrated embodiment, the reflective coating 204 is formed on the substrate 206 and the protective layer 202 is formed on the reflective coating 204. The pinning regions 210 are distributed through an interface 203 between the protective layer 202 and the reflective coating 204. Each of the pinning regions 210 locally anchors the reflective coating 204 to the protective layer 202.

Generally, a material is chosen for the pinning regions 210 that has, relative to the reflective coating 204, superior adhesive properties, although possibly inferior reflective properties. The adhesive bond at locations where the pinning regions 210 directly contact the protective layer 202 is substantially stronger than at adjacent locations where the reflective coating 204 directly contacts the protective layer 202. In the illustrated embodiment, the pinning regions 210 cover only a small fraction of the surface area of the reflector and thus do not substantially interfere in the reflection of light.

FIG. 2A illustrates a particular arrangement in which multiple pinning elements 208 are formed on a top surface of the reflective coating 204. (A pinning element is referred to herein as the structure that defines and fills a pinning region.) In the illustrated embodiment, the pinning elements 208 form small protrusions that extend out of the top surface 230 of the reflective coating 204. There are gaps between the pinning elements 208 that are filled in by portions of the protective layer 202. The pinning elements 208 may have a wide variety of shapes (e.g., elliptical, oval, whisker-like, rectangular, star-like etc.) In some implementations, the pinning elements 208 are formed by spraying a material onto the substrate, which may cause the pinning elements to have dome-like shapes and/or different sizes.

Since the pinning regions 210 need not be highly reflective, they can be made of a wide variety of suitably adhesive materials. By way of example, the pinning regions 210 may contain titanium, chrome, nickel, nickel-chrome alloy, glass, etc. The pinning regions 210 may be formed using a variety of techniques including physical deposition, chemical deposition, electroplating and spraying. Some designs involve a pinning element 208 that is integral with and/or made of the same materials as the protective layer or the substrate.

Since the material within the pinning regions 210 is generally less reflective, it is desirable to limit the size of the pinning regions 210 to increase access of incident light to the reflective coating 204. In the illustrated embodiment, for example, the pinning regions 210 are physically isolated from one another and are separated from one another by large gaps. This can be seen more clearly in FIG. 2C, which illustrates a top view of a portion of the reflector 201 of FIG. 2A. (For the purposes of clarity, the optically transparent protective layer is not shown in this figure and the relative size of the pinning regions is greatly exaggerated.) Preferably, the vast majority of the surface area of the reflector is not covered by pinning regions. Some implementations involve a reflector 201 with pinning regions 210 that cover less than 10%, 5%, 2% or 1% of the surface area 232 of the reflector 201. In some embodiments, the pinning regions 210 occupy less than 5% of the interface between the reflective coating 204 and an adjacent layer (i.e. the substrate 206 or the protective layer 202), while at least 95% of the surface of the reflective coating 204 is in direct contact with the adjacent layer.

In various embodiments, the spacing between the pinning regions 210 is controlled to strike a proper balance between reduced coverage and adhesive strength. To clarify how the spacing may be determined, it is useful to again review the buckling feature in the reflector 101 illustrated in FIG. 1B. Generally, the likelihood of buckling in a layer is a function of various factors, including the stiffness of the layer, the strength of the adhesion between the layer and an underlying structure, the degree of stress (compressive or tensile) applied to the layer and the distance over which such stress is applied. In the simplified example illustrated in FIG. 1B, the compressive forces 105 exist across the surface between the substrate 106 and the reflective coating 104, which results in the formation of the buckling feature 103 in the buckling region "a". For a large film layer of uniform thickness that is subjected to equibiaxial stress, the criteria for delamination may be characterized by the following formula, which is described in L. Freund & S. Suresh, Thin Film Materials, 262-264, 327-333 (2003):

$$\Gamma = \frac{(1 - v_f^2) h_f \sigma_m^2}{2E_f}$$

where $\Gamma$ is the bonding energy of the interface (J/m²), $v_f$ is the Poisson ratio of the buckling layer, $h_f$ is the thickness of buckling layer (μm), $E_f$ is the in-plane Young's modulus of the buckling layer (GPa), and $\sigma_m$ is the mismatch stress in the buckling layer (MPa).

Using a related analysis, the minimum size of a buckling region "a" can be determined. More specifically, if the buckling region "a" falls below a particular minimum value, a buckling feature will not be formed, if the other variables (stiffness, compressive force, etc.) are held constant. For a thin film of uniform thickness that is subjected to equibiaxial stress, the minimum radius of a circular buckle ($a_m$) may be characterized by the following formula:

$$a_m = 1.106 h_f \sqrt{\frac{E_f}{|\sigma_m|}}$$

For particular types of thin film reflectors without pinning regions the minimum buckling radius ($a_m$) may be on the order of 1 mm. In order for the pinning regions to occupy a relatively small percentage of the interface surface area, this implies that the lateral dimensions of the pinning regions be on the order of 100 μm. Larger or smaller pinning regions may be used depending on the minimum buckling radius.

The spacing of the pinning regions illustrated in FIGS. 2A and 2C is based on these concepts. More specifically, based on the characteristics of a particular thin film layer and an estimation of the compressive forces that would be applied to the layer, $a_m$ can be calculated for any thin film layer in a reflector. The spacing of the pinning regions is then based on $a_m$. In the illustrated embodiment, for example, the centers of adjacent pinning regions 210 are separated from one another by a distance d. Since no delamination is expected at the pinning regions 210, any buckling must occur along the distance d. Preferably, distance d is less than or equal to approximately $2a_m$, so that the likelihood of buckling is either eliminated or greatly reduced.

The spacing between pinning regions 210 may be uniform or non-uniform. FIG. 2C, which illustrates a top view of the reflector 201 illustrated in FIG. 2A, presents a uniform arrangement of pinning regions 210. That is, each pinning region 210 is separated from each of the other adjacent pinning regions 210 by a substantially equal distance d. This approach helps maximize the exposure of the reflective coating 204 to incident sunlight while reducing the likelihood of delamination. Alternatively, the pinning regions 210 may be arranged in a non-uniform manner. An example of this is shown in FIG. 2D, in which the distances between adjacent pinning regions 210 varies. Preferably, even in a non-uniform arrangement, the distances between the centers of adjacent pinning regions is less than d. In another embodiment, the average distance between the centers of adjacent pinning regions is approximately equal to or less than d.

Figure 3A:
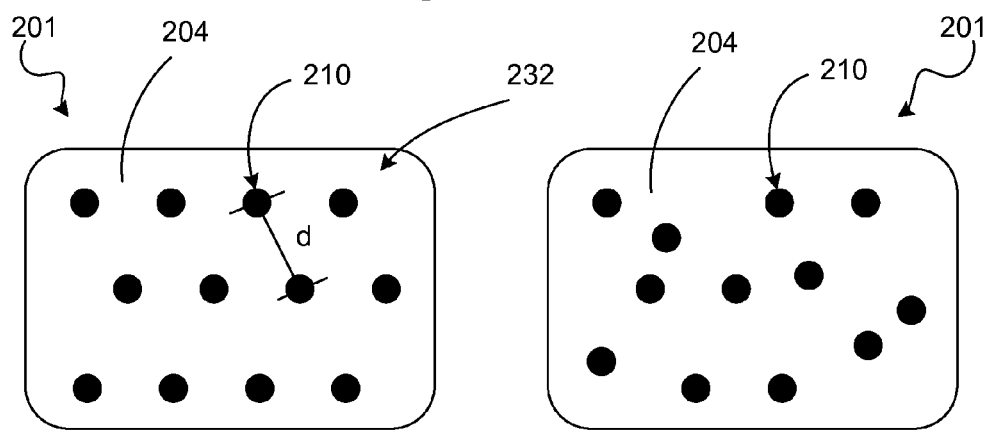
FIGS. 3A-3F are diagrammatic side views of reflectors according to various embodiments of the present invention.
Figure 3A:
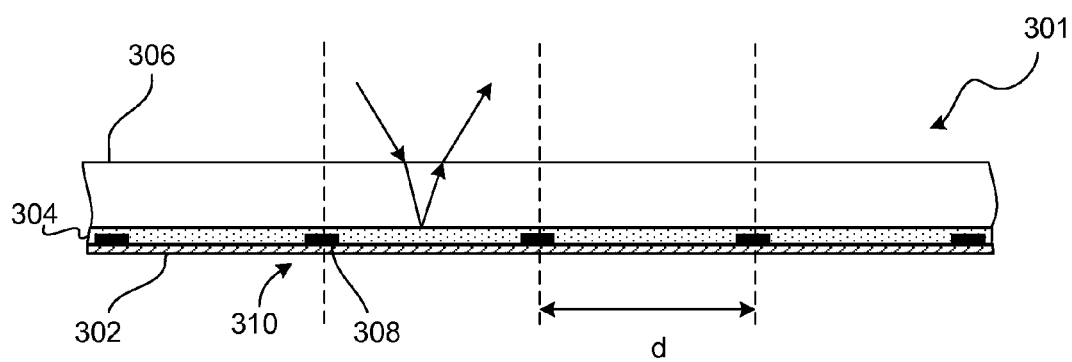

Generally, the reflective coating 304 is made of a material that has excellent reflective properties but which may have poor adhesive properties. For example, silver works well as a material for the reflective coating 204, although any other suitable reflective material may be used, such as aluminum. The protective layer 202 may be made of a wide variety of organic or inorganic materials, such as urethane acrylate, polyimide, photopolymers, silicon dioxide, silicon dioxide/titanium dioxide, aluminum oxide, sol-gel glass etc. Various implementations involve a substrate that is made of a metal, glass, a thin film polymer (e.g., Mylar) and/or any other suitable material. The composition of the substrate 206 and the protective layer 202 may depend on their orientation relative to the reflective coating 204. For example, in the illustrated embodiment the reflective coating 204 is formed on the top surface of the substrate 206. Light passes through a protective layer 202 and is reflected by the reflective coating 204. That is, the protective layer 202 in this case must be made of a transparent material. In another embodiment, however, the reflective coating 204 is on a bottom surface of a substrate 206, which is transparent and arranged to pass light through (e.g., as shown in FIG. 3A.) It should be appreciated that the protective layer 202, the reflective coating 204, the substrate 206 and the pinning regions/elements do not necessarily have uniform compositions. That is, they each may include multiple sublayers of different materials. Additionally, in some embodiments, various intermediate layers may be situated between the substrate 206 and the reflective coating 204 and the protective layer 202 and the reflective coating 204.

Generally, the substrate 206 of the reflector 201 is substantially thicker than the overlying reflective and protective layers 204 and 202, although this is not a requirement. By way of example, the thickness 214 of the reflective coating 204 may be approximately between 20 and 200 nm, although thicker and thinner layers are also possible. Some implementations involve a protective layer 202 with a thickness 212 of approximately between 0.1 μm and 20 μm and a substrate 206 with a thickness 216 of half a millimeter or more.

Depending on the arrangement of the pinning regions 210, the adhesive strength between adjacent layers may be increased at one or more interfaces. In the illustrated embodiment of FIG. 2B, for example, the pinning region 210 is positioned through an interface 203 between the thin film layers (i.e., the reflective coating 204 and the protective layer 202.) Since the pinning region 210 of FIG. 2B is not positioned through an interface 205 between the thin film reflective coating and the substrate 206, the pinning region 210 does not locally anchor the reflective coating 204 to the substrate 206. In some embodiments, however, the pinning regions 210 are arranged to extend through both interfaces 203 and 205 and therefore help secure all of the layers together.

Referring next to FIGS. 3A-3E, side views of reflectors according to various embodiments of the present invention will be described. FIG. 3A illustrates a reflector 301 that is somewhat similar to the one illustrated in FIG. 2A, except that the layers of the reflector 301 are rearranged. That is, the pinning regions 310 are formed on a top surface of the protective layer 302, which is situated at the bottom of the reflector 301. The protective layer 302 may be strong enough to be mechanically self-supporting. The reflective coating 304 is positioned over the top surface of the protective layer 302 and the pinning regions 310. The reflective coating 304 is attached with the bottom surface of a substrate 306. When the reflector 301 is in operation, light passes through and may be slightly refracted by the transparent substrate 306. The light then reaches the reflective coating 304 and is directed away from the reflector 301 as indicated by the arrows.

Figure 3B:
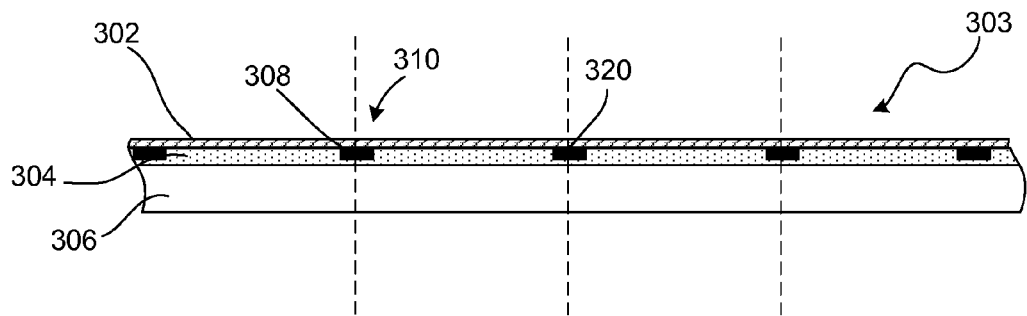

Referring next to FIG. 3B, a reflector 303 with a treated reflective coating 304 according to another embodiment of the present invention will be described. In the illustrated embodiment, the pinning regions 310 are formed by treating selected portions 320 of the reflective coating 304. This may be done in a wide variety of ways. For example, selected portions 320 of the reflective coating may be chemically altered to form an alloy that adheres substantially more to the overlying protective layer that untreated portions of the reflective coating 304. Generally, these treated, selected portions 320 of the reflective coating do not penetrate entirely through the reflective coating 304, although this is not a requirement.

Figure 3C:
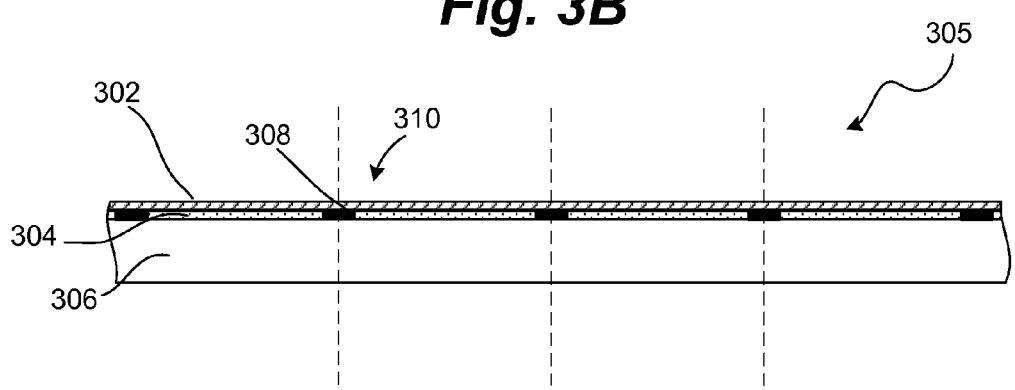

Referring next to FIG. 3C, a reflector 305 according to another embodiment of the present invention will be described. The main difference between the reflector 305 illustrated in FIG. 3C and the reflector 201 illustrated in FIG. 2A is that the pinning elements 308 penetrate entirely through the reflective coating 304, instead of being formed on the top surface of the reflective coating 304. Each pinning element 308 directly contacts and adheres to the protective layer 302 and the substrate 306. Accordingly, the reflective layer 304 is firmly sandwiched therebetween.

Figure 3D:
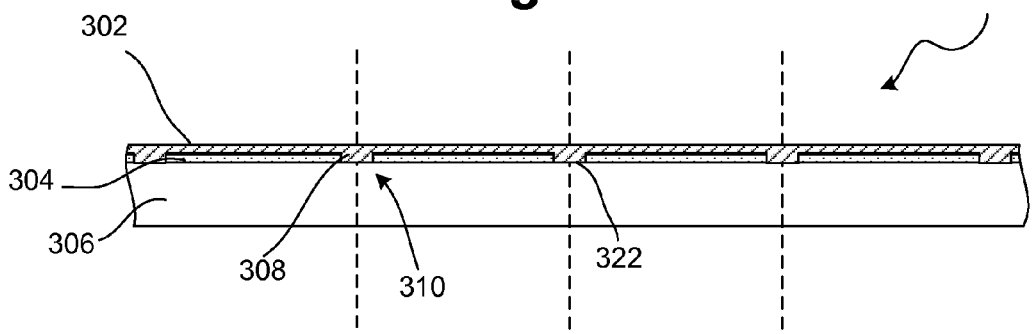

FIG. 3D is a side view of a reflector 307 with a protective layer 302 with elevated regions 322 in accordance with another embodiment of the present invention will be described. Like the reflector 305 illustrated in FIG. 3C, the reflector 307 includes a top protective layer 302, a middle reflective coating 304, a substrate 306 and multiple pinning regions 310 that extend entirely through the reflective coating 304. In the illustrated embodiment, however, the pinning regions 310 are not filled with a material that is distinct from that of the protective layer 302. Instead, the pinning elements 308 in the pinning regions 310 are extensions of and integral with the overlying protective layer 302. The pinning elements help secure two interfaces within the reflector 307: the interface between the thin film protective layer 302 and the thin film reflective coating 304 and the interface between the thin film layers and the substrate 306.

In the illustrated embodiment, there are elevated regions 322 that extend out of the bottom surface of the protective layer 302 and that come in direct contact with the substrate 306. The reflective layer 304 covers the substrate 306 and fills in the gaps between the elevated regions 322 of the protective layer 302. The adhesive bond at locations where the protective layer 302 directly contacts the substrate 306 is substantially stronger than at those locations where the reflective coating 304 directly contacts the substrate 306.

Figure 3E:
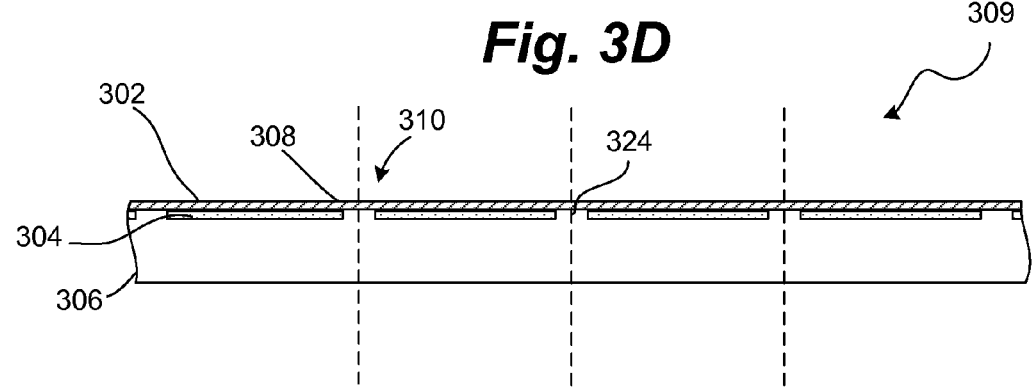

Referring now to FIG. 3E, a reflector 309 with a substrate 306 that has elevated regions 324 according to another embodiment of the present invention will be described. The substrate 306 includes elevated regions 324 that extend out of a top surface of the substrate 306. The reflective layer 304 is positioned on the substrate 306 such that it fills gaps between these elevated regions 324. In various embodiments, a top surface of the reflective coating 304 is substantially coplanar with top surfaces of the elevated regions 324 of the substrate 306. A protective layer 302 is positioned on the reflective layer 304 and is in direct contact with the elevated regions 324 of the substrate 306. In comparison to the reflective coating 304, the elevated regions 324 of the substrate 306 adhere substantially better to the overlying protective layer 302.

Figure 3F:
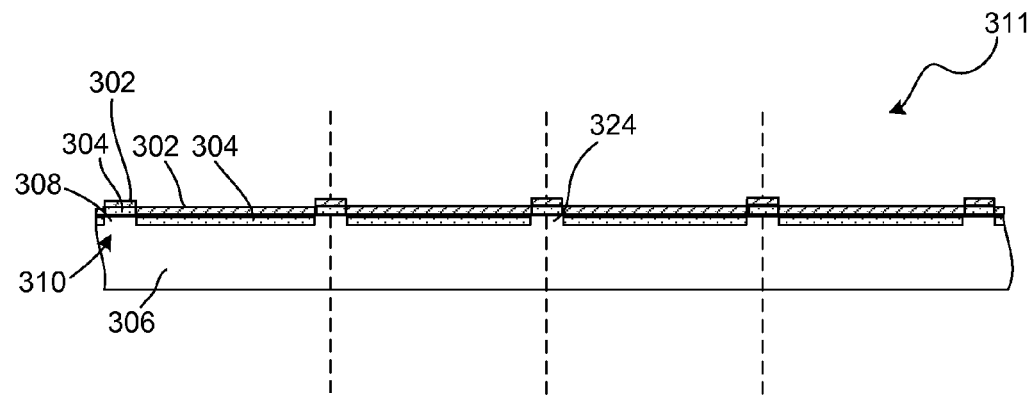

The figures described above generally illustrate reflectors with planar top and bottom surfaces. The present invention also contemplates embodiments in which this is not the case. Referring next to FIG. 3F, a reflector 311 with nonplanar layers according to another embodiment of the present invention will be described. The substrate 306 includes elevated regions 324 that extend out of its top surface. The overlying reflective coating 304 fills gaps between these elevated regions 324 and also covers the elevated regions 324. As a result, some portions of the reflective coating 304 are positioned higher than others. The protective layer 302 conforms to the profile of the underlying layers and is similarly nonplanar. For some applications, the above reflector design may be useful. Generally, the non-planar portions of the reflector may be kept so small such that they do not substantially interfere with the proper reflection of light. One advantage of the above type of reflector design is that it may remove processing steps and therefore may be more cost-effective to manufacture.

Figure 3G:
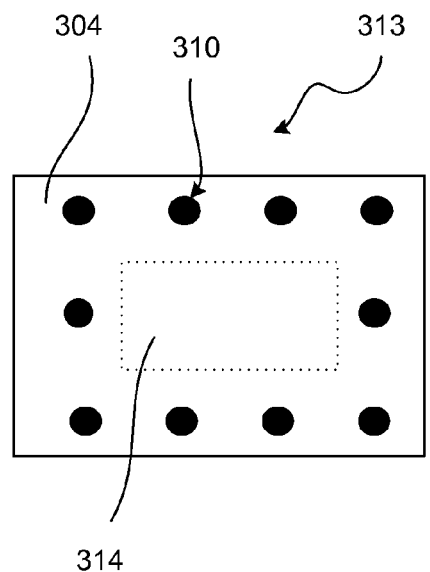
FIG. 3G is a diagrammatic top view of a reflector in which the pinning regions are positioned at the periphery of the reflector according to a particular embodiment of the present invention.

Referring now to FIG. 3G, a reflector 313 with peripheral pinning regions 310 according to another embodiment of the present invention will be described. In the illustrated embodiment, the pinning regions 310 are arranged only along the periphery of the reflector 313. In an alternative embodiment, there are pinning regions 310 across the entire reflector 313, but the density of pinning regions 310 are greater at the periphery then at the central region 314 of the reflector 313 (e.g., the aforementioned distance d between adjacent pinning regions may be smaller at the periphery than at the central region 314.) For various reasons, it is particularly important to prevent delamination, deformation, and cracking at the periphery of the reflector. Generally, the periphery of the reflector is more prone to bending or twisting. Cracking or delamination often begins at the edges of the reflector and then propagates inward towards the center of the reflector. Additionally, the multiple layers that make up the reflector may be exposed at the periphery of the reflector, which could allow moisture and other contaminants to seep between the layers of the reflector. Concentrating the pinning regions 310 at the periphery of the reflector 313 can help prevent such problems.

Figure 3H:
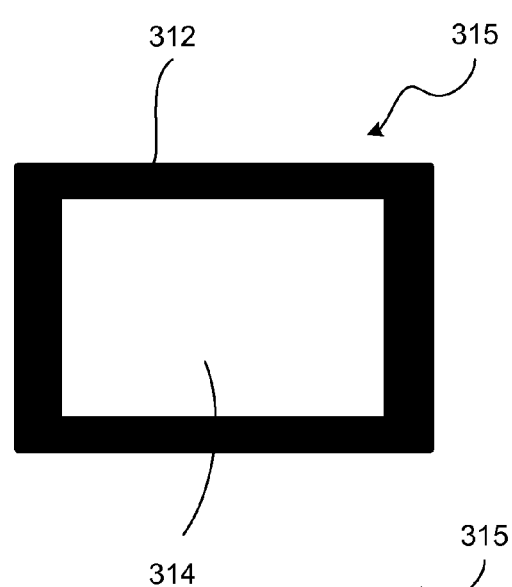
FIG. 3H is a diagrammatic top view of a reflector in which a continuous pinning structure extends around the periphery of the reflector according to a particular embodiment of the present invention.
Figure 3I:
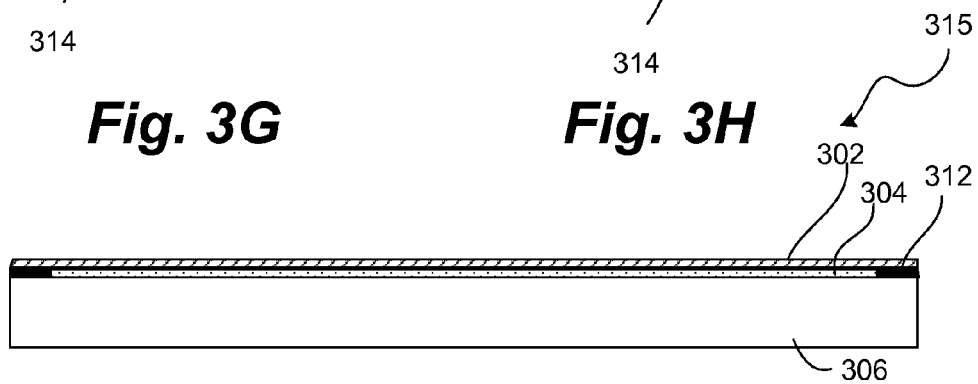
FIG. 3I is a diagrammatic side view of the reflector illustrated in FIG. 3H

Referring next to FIGS. 3H and 3I, a reflector 315 with a continuous pinning structure 312 according to a particular embodiment of the present invention will be described. FIGS. 3H and 3I are, respectively, top and side views of the reflector 315. The pinning regions are defined by single continuous pinning structure 312 that extends along the periphery of the reflector 315 and entirely surrounds a central region 314 of the reflector 315. The pinning structure 312 may be formed in the same way as any pinning element described herein. In the illustrated embodiment, for example, the pinning structure 312 extends past the reflective coating 304 and directly contacts the reflective coating 304 and the substrate 306. In another embodiment, the pinning structure 312 may be a wall-like structure that is formed on a top surface of the reflective coating 304 (e.g., similar to the way in which the pinning element 208 is formed on the top surface of the reflective coating 204 in FIG. 2A.) In this embodiment, the protective layer 302 would fill in a large gap between the "walls" of the pinning structure 312 at the central region 314 of the reflector 315.

It should be appreciated that the present application is not limited to the specific examples described above. The present application also contemplates a wide variety of arrangements involving combinations of the features shown in different figures. By way of example, FIGS. 2A-2C and FIGS. 3A-3I illustrate various types of pinning elements and pinning regions (e.g., pinning regions that do or do not extend entirely through the reflective coating, pinning regions that are arranged at the periphery of the reflector, pinning regions that are extensions of and are integral with the protective layer and/or the substrate, pinning regions that are on the backside of a substrate, etc.) Any feature of a pinning region or reflector illustrated in a particular figure may be added to or used to modify a pinning region or a reflector illustrated in another figure.

Figure 4A:
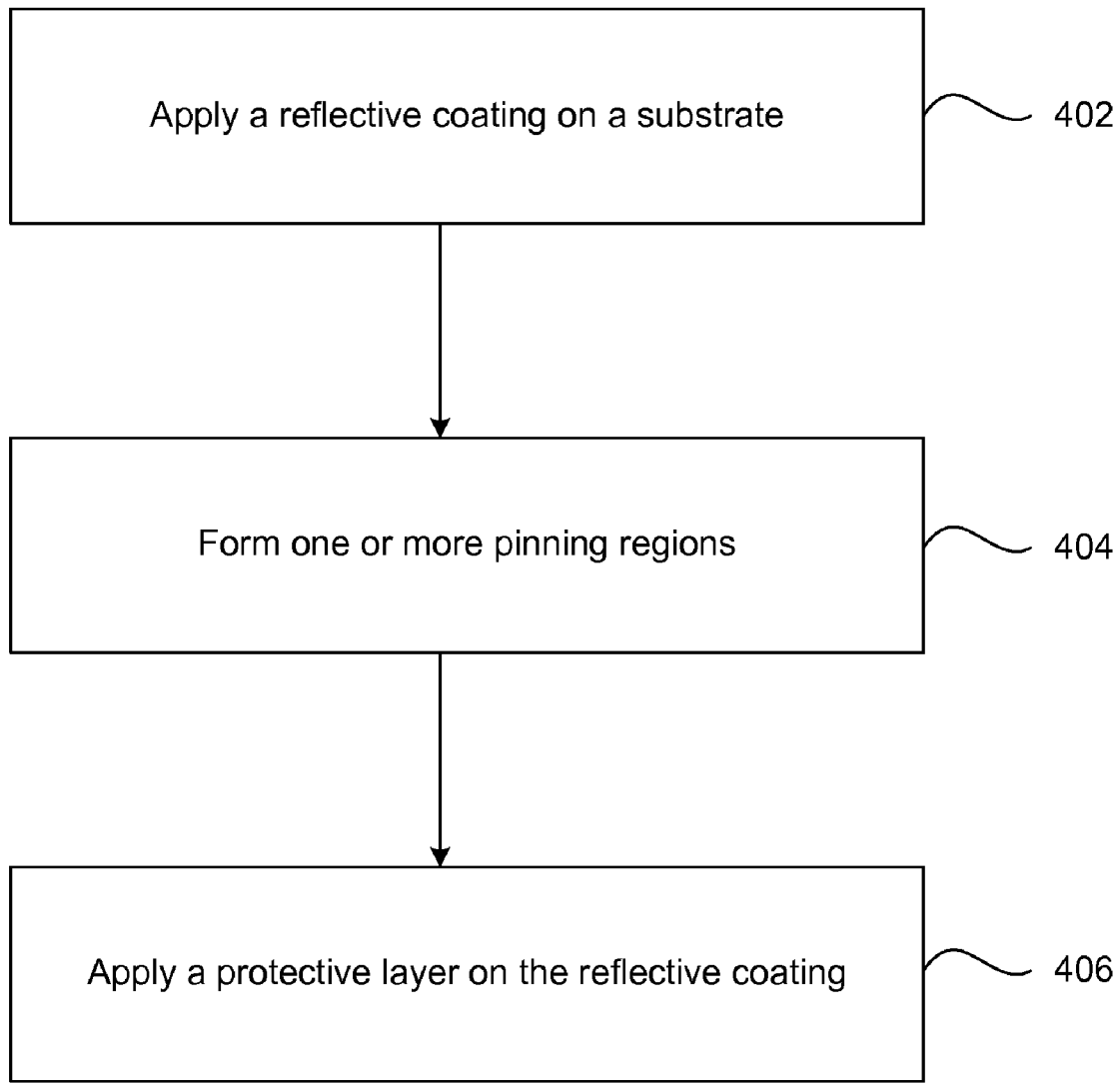
FIGS. 4A-4B are flowcharts illustrating methods for forming a reflector according to various embodiments of the present invention.
Figure 5A:
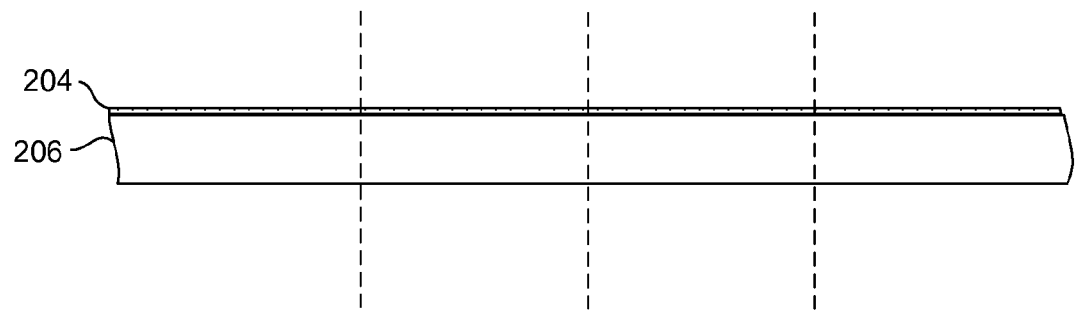
FIGS. 5A-5C, 6A-6D, 7A-7C, 8A-8C and 9A-9C are diagrammatic side views of methods for forming reflectors according to various embodiments of the present invention.

Referring now to FIG. 4A and FIGS. 5A-5C, a method for forming the reflector 201 illustrated in FIG. 2A according to a particular embodiment of the present invention will be described. Initially, a thin film reflective coating 204 is applied over a top surface of a substrate 206 (FIG. 5A and step 402 of FIG. 4A.) The substrate 206 may be formed from any material that is suitable for physically supporting the other layers of the reflector 201, such as metal, glass, polymer, etc. In some embodiments, the substrate 206 is intended to allow the passage of light and is therefore transparent. Highly reflective metals such as silver and aluminum work well as materials for the reflective coating 204. The reflective coating 204 may be applied to a thickness of approximately between 20 and 200 nm, although larger and smaller thicknesses are also possible.

The reflective coating 204 may be applied using a wide variety of different thin film deposition techniques, depending on the needs of a particular application. For example, the applying of the reflective coating 204 may involve physical vapor deposition, electron beam deposition, sputtering, chemical deposition, screen printing, electroless plating and/or electroplating. Some approaches involve the thermal evaporation of metals into a vapor that is then deposited on the substrate 206 in one or more layers. Such deposition processes may be conducted in high vacuum with small quantities of gases such as oxygen or ammonia to react with the evaporated material to form the thin film reflective coating. During the deposition process, the underlying layer may be bombarded by an ion beam to cause microstructural, chemical or other physical changes in the layer to help form the desired thin film. In various embodiments, a reactive species or precursors may be applied to the underlying layer in a liquid form, which reacts (e.g., in a redox reaction, sol-gel reaction, etc.) to form the desired thin film. (It should be noted that the above techniques may be utilized whenever a thin film layer is being formed in accordance with one of the embodiments described in the present application, irrespective of whether the underlying layer is the substrate or another thin film layer.)

Figure 5B:
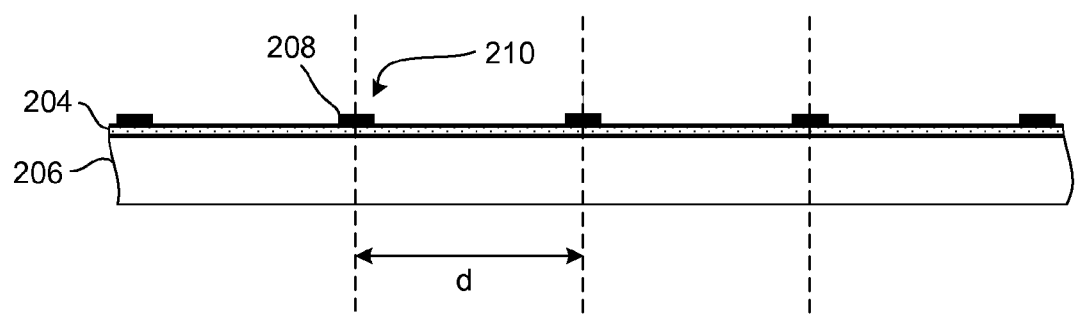

Afterward, one or more pinning regions 210 are formed over a top surface of the reflective coating (FIG. 5B and step 404.) In this example, each pinning region 210 is defined by pinning element 208 that is made up of a material with strong adhesive properties. For example, titanium, chrome, nickel, a metal alloy, nickel chrome alloy and glass work well for various embodiments. The pinning elements are physically isolated from one another and are distributed across the top surface of the reflective coating 204. There may be a distance $d<2a_m$ separating adjacent pinning elements 208, where $2a_m$ is calculated for the thin film reflective coating 204 based on the factors discussed earlier in this application.

The pinning elements 208 may be formed in various ways. For example, a particular approach involves spraying a suitably adhesive material onto the reflective coating 204 to form the spaced apart pinning elements 208. Some approaches involve the spraying of liquid beads or droplets of the material on the reflective coating 204 in a non-uniform pattern (e.g., as seen in FIG. 2C.) The pinning elements 208 may also be formed using any thin film deposition techniques discussed in the present application, including chemical deposition, electroplating and vapor deposition.

Another approach for forming the pinning elements involves applying a continuous thin film layer of the pinning element material over the reflective coating 204. This may be performed using any of the aforementioned thin film deposition techniques. This layer may then be etched using any known, suitable method to form the spaced apart pinning elements 208. By way of example, the selective removal of portions of the thin film may involve laser ablation, chemical solvents, mechanical abrasion and/or photolithography.

Figure 5C:
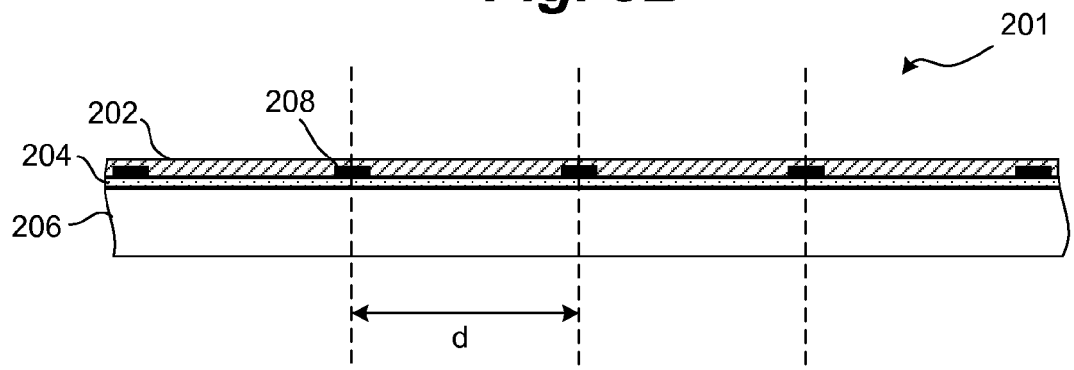

At step 406, a thin film protective layer of FIG. 5C is applied directly onto the reflective coating 204 and the pinning elements 208 to form the reflector 201 illustrated in FIG. 2A. The protective layer 202 may be made from any suitably impermeable, resilient and/or transparent material (e.g., ceramic, a dielectric material, polyimide, oxide, glass, urethane acrylate, fluoropolymer, silicon dioxide, silicon dioxide/titanium dioxide mixture, aluminum oxide, sol-gel glass etc.) The application of the protective layer 202 may involve any of the thin film deposition techniques described above. Some deposition processes involve the thermal evaporation of ceramics or dielectrics into a vapor that is deposited over the reflective coating 204. These processes may be conducted in high vacuum with small quantities of gases such as oxygen or ammonia to react with the evaporated material to form a ceramic or dielectric thin film protective layer 202.

The protective coating 202 covers the spaced apart pinning elements 208 and fills in gaps between them. Due to the materials used to form the pinning elements 210, the strength of the adhesive bond at the interface between the protective layer and the reflective coating is substantially stronger at the pinning regions 210 than at the gaps between the pinning regions 210. In some embodiments, the protective coating 202 is applied to form a planar top surface for the reflector 201. In another embodiment, the protective coating 202 is applied substantially evenly over the reflective coating 204 and the pinning elements 208, which may cause the top surface of the reflector 201 to be non-planar.

The steps illustrated in FIG. 4A may be reordered and/or modified in a wide variety of ways to form different types of reflectors. Referring now to FIG. 4A and FIGS. 6A-6D, a method for forming the reflector 307 illustrated in FIG. 3D according to another embodiment of the present invention will be described. Initially, masking features 326 are formed on a top surface of the substrate 306 of FIG. 6A. The masking features 326 may be formed from any suitable material that can later be readily removed from the substrate 306, such as a dissolvable photoresist. In some implementations, the masking features 326 are formed by first depositing a layer of the material over the reflective coating and then etching the material to define the masking features. In another implementation, the masking features 326 are spot deposited over the surface of the reflective coating. For example, they may be sprayed over the reflective coating to form spaced apart masking features 326 in the form of liquid beads or droplets. Some approaches involve forming masking features 326 that are made of small particles and/or have whisker- or filament-like shapes. In another embodiment, the masking feature takes the form of a tape that is arranged to be pulled off after the reflective coating is applied. This approach works well when forming a reflector in which the pinning regions are concentrated at the periphery of the reflector (e.g., the reflector 315 illustrated in FIG. 3H.) In such a case, the tape can be applied at the edges and along the periphery of the substrate, so that any reflective coating that forms on the tape can be later removed by pulling off the tape.

Figure 6A:
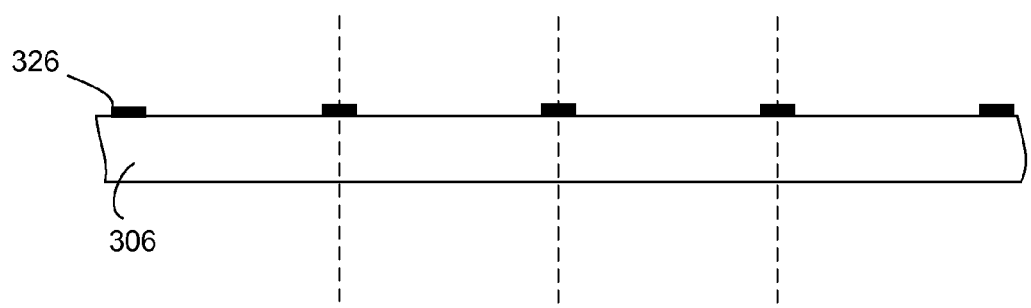
Figure 6B:
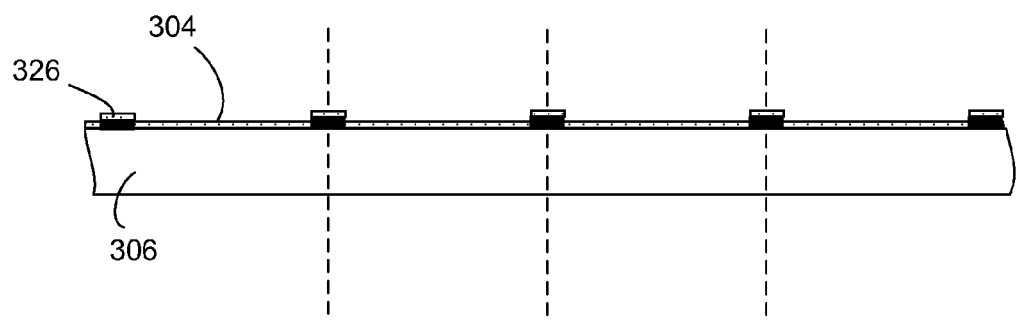

Afterward, a reflective coating 304 is applied over the masking features (FIG. 6B and step 402 of FIG. 4A.) The reflective coating 304, which may be applied using any of the aforementioned thin film deposition techniques, covers the top surface of the substrate 306 and possibly the masking features 326. In an embodiment in which the masking feature 326 is dissolvable, the reflective coating 304 preferably does not entirely encapsulate each masking feature so that a suitable solvent has access to it, although this is not a requirement.

Figure 6C:
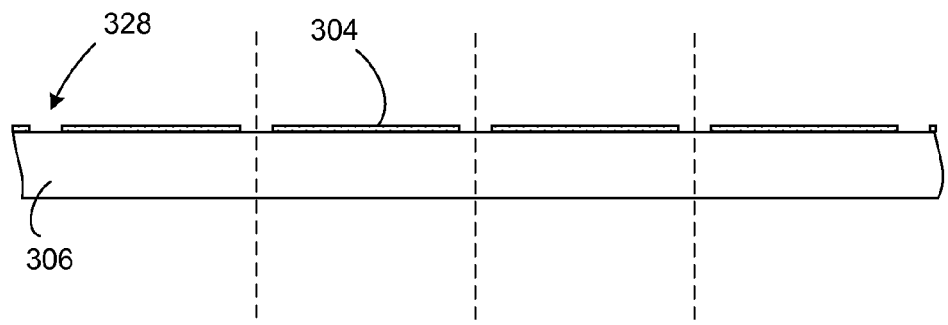

In FIG. 6C, the masking features 326 are removed. The techniques used to remove the masking features may vary, depending on the composition of the masking features 326 and the way in which they were applied. By way of example, a chemical solvent may be applied to dissolve the masking features 326. Some approaches involve burning away masking features that are made of organic or carbonaceous materials. In another approach, the masking features 326 (e.g., a tape) are mechanically pulled or peeled off from the underlying surface. Once the masking features 326 are removed, multiple recesses 328 are left in the reflective coating where the masking features were. As a result, underlying portions of the substrate 306 are exposed.

In various embodiments, recesses 328 are formed in the reflective coating 306 without the use of masking features 326. By way of example, after the initial deposition of the thin film reflective coating 304 (e.g., as seen in FIG. 6A), suitable portions of the reflective coating 304 can be removed using any technique familiar to those of ordinary skill in the art. Some embodiments involve etching the reflective coating 304 using laser ablation or mechanical abrasion. These techniques also form recesses 328 that expose underlying portions of the substrate 306.

Figure 6D:
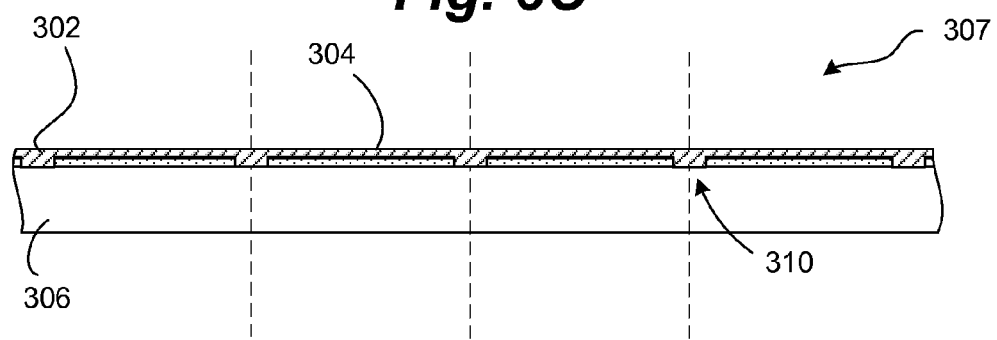

After the removal of portions of the reflective coating 304, a thin film protective layer 302 is formed over the reflective coating 304 (FIG. 6D and step 406 of FIG. 4A.) The application of the protective layer 302 may involve any of the aforementioned thin film deposition techniques. The protective layer 302 covers the reflective coating 304, fills the recesses 328 in the coating and therethrough comes in direct contact with the top surface of the substrate 306. The portions of the protective layer 302 that fill the recesses define the pinning regions 310 for the reflector. That is, protrusions that extend from the bottom surface of the protective layer 302 act as pinning elements 308 for the reflector 309.

A particular implementation of the method illustrated in FIGS. 6A-6D involves filling the recesses 328 with a distinct pinning element material before applying the protective layer. In this implementation, the pinning element material differs from the materials used to form both the overlying protective layer 302 and the underlying reflective coating 304. Examples of suitable pinning element materials include titanium, chrome, nickel, an alloy, nickel-chrome alloy and glass. In this approach, before the protective layer 302 is formed over the reflective coating 304, a pinning element material is deposited into the recesses 328 in the reflective coating 304. To fill the recesses 328, the pinning element material may be initially applied as layer that covers both the reflective 304 coating and fills the recesses 328. The layer may then be etched such that the top surface of the reflective coating 304 is exposed and/or the top surfaces of the pinning elements 308 are coplanar with the top surface of the reflective coating 304. In another embodiment, each of the recesses 328 are spot-filled in a manner that leaves the top surface reflective coating 304 uncovered. Afterward, the protective layer 302 is formed over the pinning elements 308 and the reflective coating 304. In this implementation, the protective layer 302 is optionally flat and has a substantially uniform thickness, unlike the protective layer 302 of the reflector 309 illustrated in FIG. 6D. The above approach may be used to form the reflector 305 illustrated in FIG. 3C.

Figure 7A:
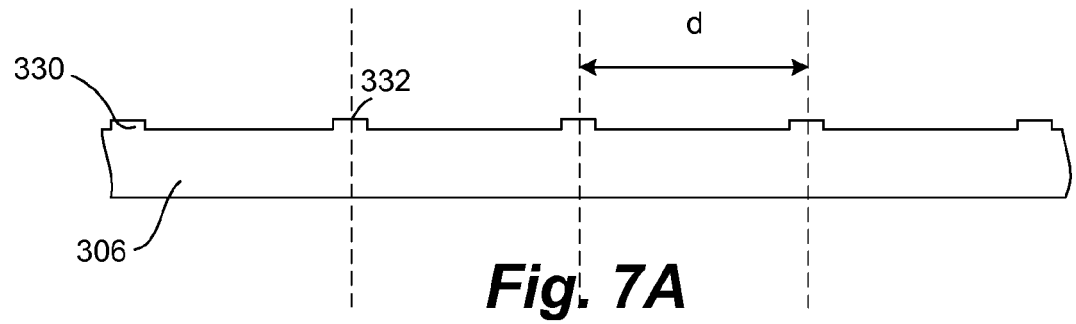
Figure 7B:
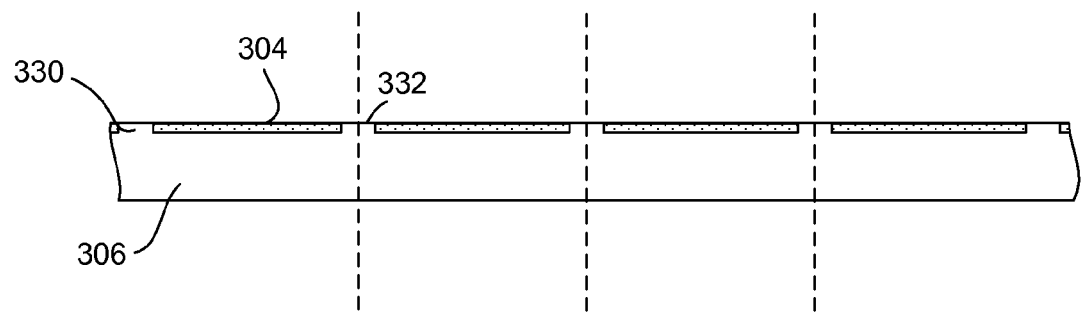
Figure 7C:
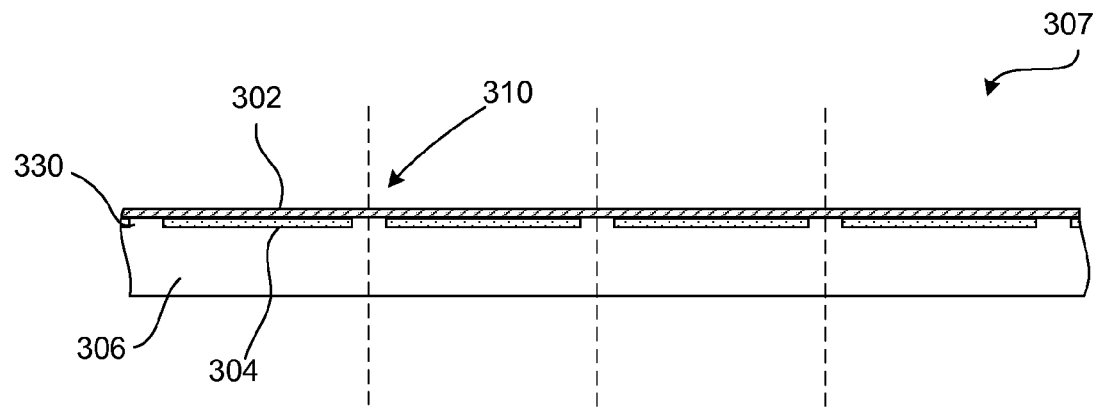

Referring next to FIGS. 7A-7C, a method for forming the reflector 307 illustrated in FIG. 3E according to another embodiment of the present invention will be described. Initially, a substrate 306 of FIG. 7A is provided that includes elevated regions 330 in its top surface. There are gaps between the elevated regions 330, which are distributed along the length of the underlying substrate 306. In various embodiments, the centers of adjacent elevated regions 330 are separated by a distance $d < 2a_m$, whose calculation was discussed elsewhere herein.

A thin layer reflective coating 304 is then applied over the substrate 306 (step 402 of FIG. 4A and FIG. 7B.) There are various ways to arrange the reflective coating 304 over the substrate. In a particular embodiment, the reflective coating 304 is selectively applied only within the gaps between the elevated regions 330 of the substrate, such that the top surfaces 332 of the elevated regions 330 are uncovered. In another embodiment, the reflective coating is deposited over the entire substrate 306. Then, portions of the reflective coating 304 are removed to expose the top surfaces 332 of the elevated regions 330. The selective etching of portions of the reflective coating may be performed using any technique known in the art (e.g., laser ablation, mechanical abrasion, photolithography, etc.) Generally, the top surfaces 332 of the elevated regions 330 and a top surface of the reflective coating 304 are substantially coplanar, although this is not a requirement.

Afterward, a protective layer 302 is deposited over the reflective coating 304 and the substrate 306 (step 404 of FIG. 4A and FIG. 7C.) The elevated regions 330 of the substrate 306 come in direct contact with the overlying protective layer 302 and help anchor the protective layer 302 to the rest of the reflector. That is, the elevated regions 330 of the substrate 306 define the pinning regions 310 for the reflector.

Referring now to FIG. 4A and FIGS. 8A-8C, a method for forming the reflector 305 illustrated in FIG. 3B according to another embodiment of the present invention will be described. Initially, a reflective coating 304 is formed over a substrate 306 (step 402 of FIG. 4A and FIG. 8A.) Selected portions 334 of the reflective coating are then treated to form pinning regions 310 (step 404 of FIG. 4A and FIG. 8B.) That is, the selected portions 334 of the reflective coating 304 are chemically altered such that their composition or physical properties differ from that of the rest of the reflective coating 304. As a result of the treatment, the selected portions 334 become less reflective and/or substantially more adhesive. A variety of techniques may be used to treat the reflective coating 304 in this manner. By way of example, selected portions of the reflective coating 304 may be chemically altered to form an alloy. In one embodiment, the selected portions 334 of the reflective coating 304 may be heat treated. Various applications involve altering the selected portions 334 of the reflective coating 304 by exposing them to UV radiation and/or immersing them in a solution. In the illustrated embodiment, the treated pinning regions 310 extend into but not entirely through the reflective coating 304, although in other embodiments, the pinning regions 310 extend entirely through the reflective coating such that they come in direct contact with the underlying substrate 306.

Figure 8A:
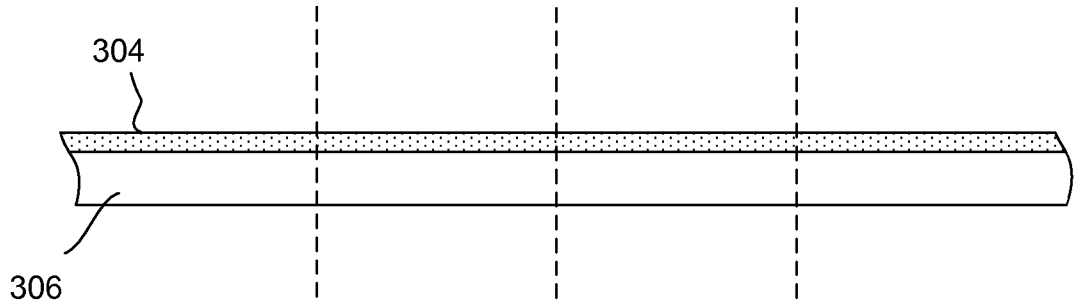
Figure 8B:
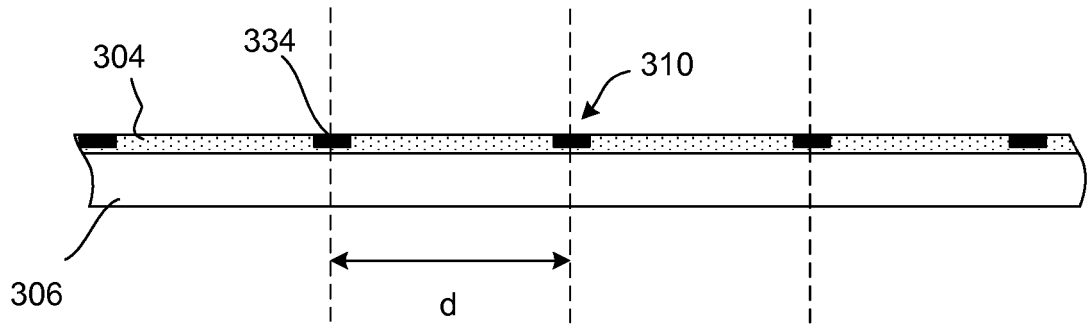
Figure 8C:
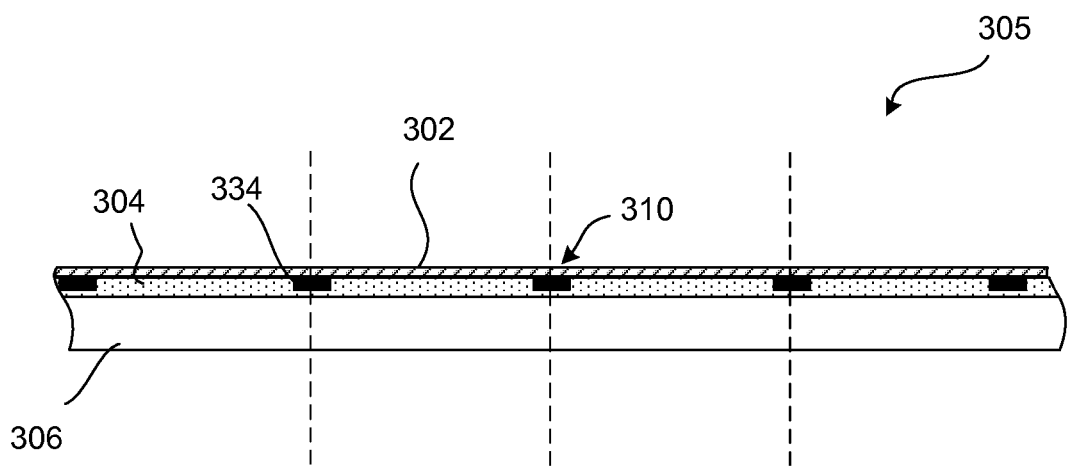

At step 406 of FIG. 4A and FIG. 8C, a thin film protective layer 302 is applied over the reflective coating 304. The protective layer 302 may be deposited using any of the aforementioned techniques for forming thin film layers. Compared to the adjacent untreated regions, the treated regions of the reflective coating 304 (i.e., the pinning regions 310) adhere substantially more strongly to the overlying protective layer 302.

Referring next to FIG. 4B and FIGS. 9A-9C, a method for forming a reflector according to another embodiment of the present invention will be described. This method may be somewhat similar in several respects to the method illustrated in FIG. 4A and FIGS. 5A-5C (e.g., the composition of the materials used, the manner in which some materials are deposited, etc.), although the steps are in a different order.

Initially, multiple spaced apart pinning regions are formed over a surface of the substrate 306. The pinning regions and their corresponding pinning elements may be formed and spaced in any manner described herein (e.g., in a manner similar to the way in which pinning regions 308 were formed and distributed over the reflective coating 304 in FIGS. 5A-5C.)

Figure 4B:
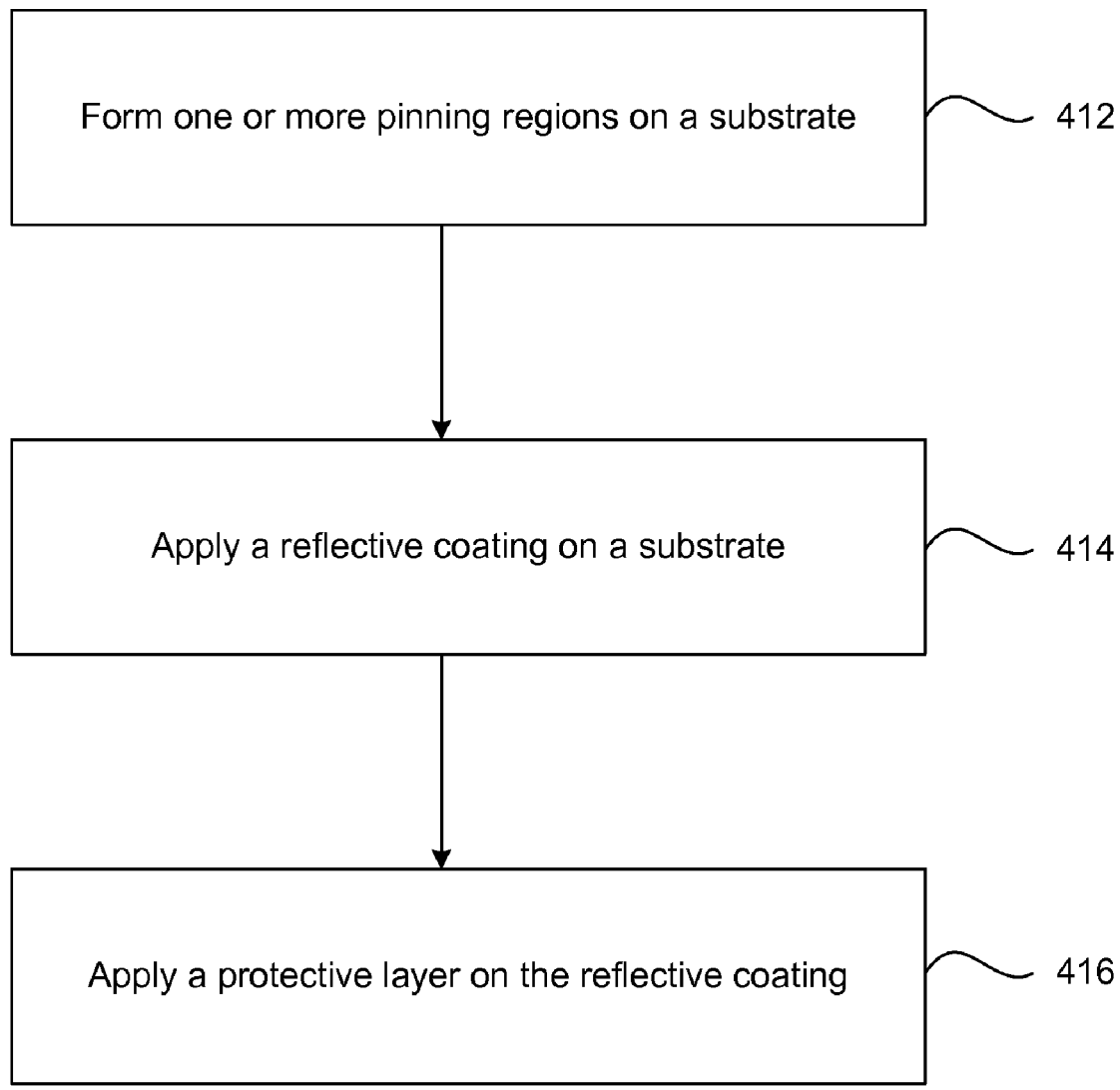
Figure 9A:
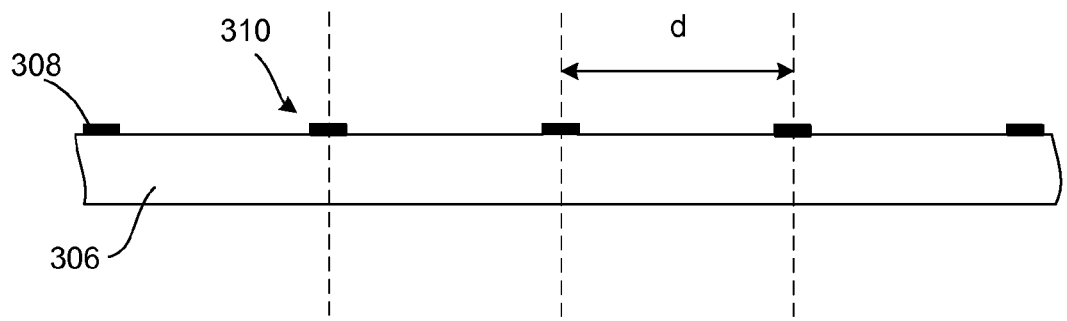
Figure 9B:
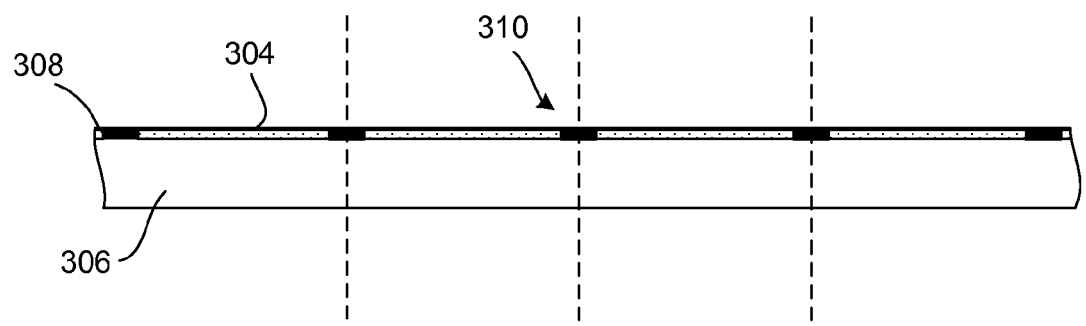
Figure 9C:
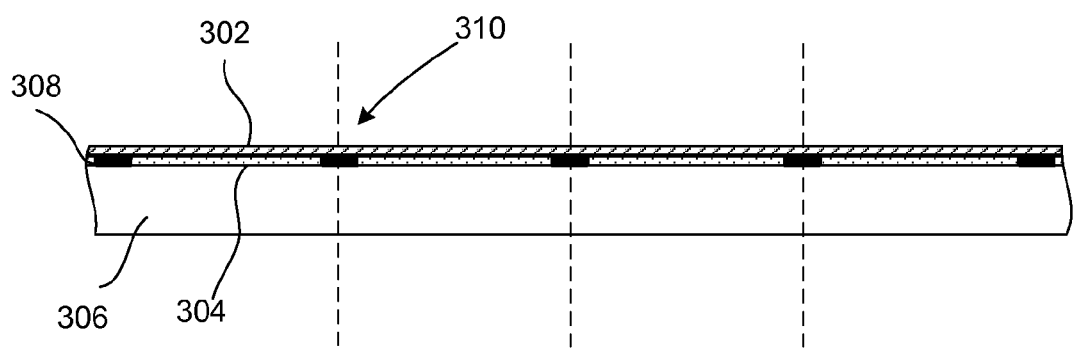

Afterward, the reflective coating is applied over the pinning regions 308 and the substrate 306 (step 414 of FIG. 4B and FIG. 9B.) The reflective coating may be applied using any thin film deposition technique described herein. In the illustrated embodiment, top surfaces of the pinning elements 308 are substantially coplanar with top surfaces of the reflective coating, although this is not a requirement. In another embodiment, the reflective coating completely covers the pinning elements. The pinning regions are distributed along an interface between the reflective coating and the substrate, thereby helping to locally anchor the reflective coating to the substrate. At step 416 of FIG. 4B and FIG. 9C, a protective layer 302 is applied over the reflective coating 304. The reflective coating 304 may be deposited using any thin film deposition technique described herein.

Although the methods described in connection with FIGS. 5A-5C, 6A-6D, 7A-7C, 8A-8C and 9A-9C involve placing pinning regions and a reflective coating on the top surface of a substrate, it should be appreciated that the steps of the aforementioned methods may be reordered and modified to also form a reflector whose reflective coating is attached with the bottom surface of a transparent substrate. (An example of such a reflector is the reflector 301 of FIG. 3A.)

Figure 10A:
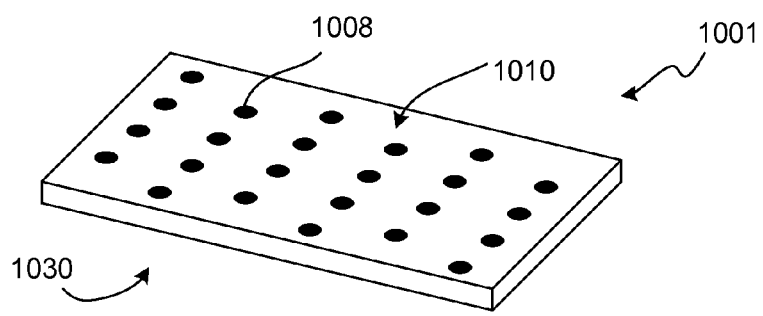
FIG. 10A is a diagrammatic perspective view of a photovoltaic cell with pinning regions according to a particular embodiment of the present invention.
Figure 10B:
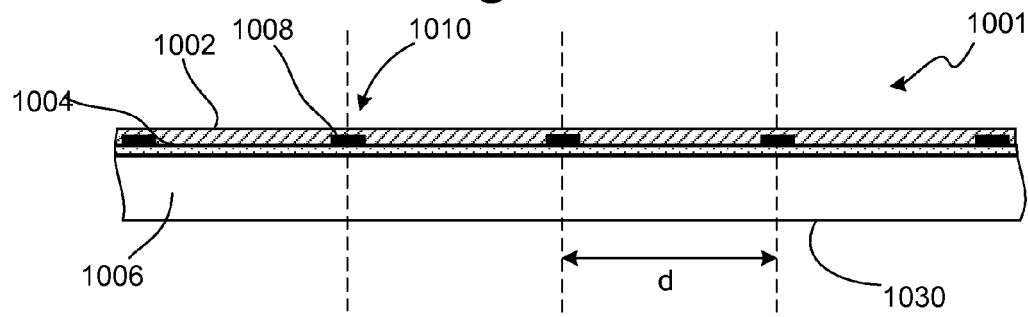
FIG. 10B is a diagrammatic side view of the photovoltaic cell illustrated in FIG. 9A.
Figure 10C:
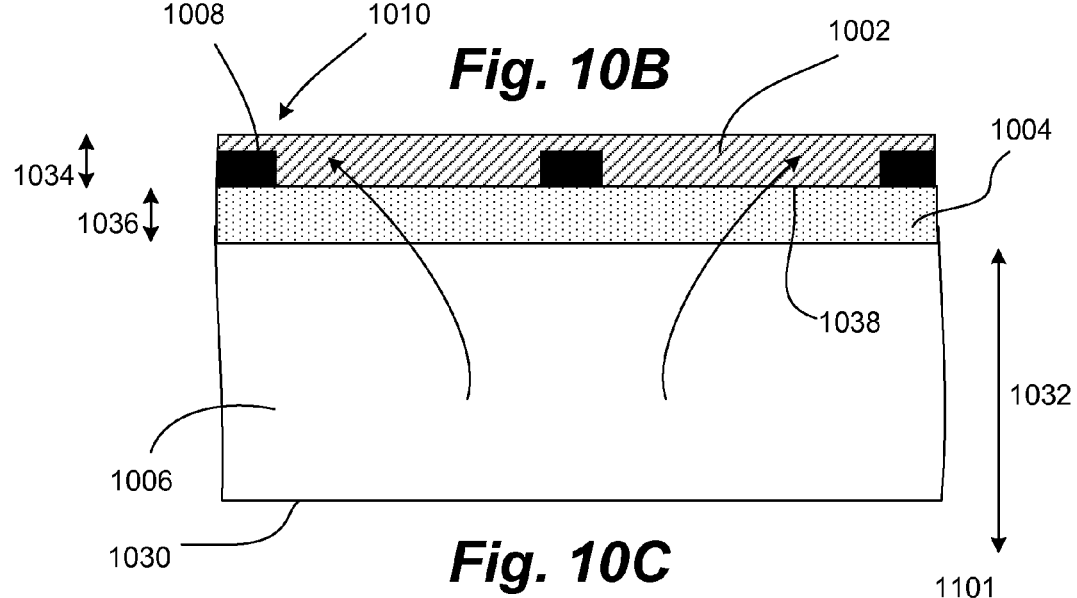
FIG. 10C is an enlarged view of a portion of the photovoltaic cell illustrated in FIG. 9B.

The use of pinning regions is not limited to reflectors, but may also be utilized to form a wide variety of multilayered, components. Generally, these components have in common a surface covered by a least one thin film coating and designed to reflect or transmit some form of energy through the coating. The energy may be in the form of an electrical current, electromagnetic radiation, heat, a mechanical wave, such as sound or other type of energy. By way of example, FIGS. 10A-10B are diagrammatic perspective and side views of a photovoltaic cell 1001 according to a particular embodiment of the present invention. FIG. 10C is an enlarged view of a portion of the photovoltaic cell 1001 illustrated in FIG. 10B. The photovoltaic cell 1001 includes a substrate 1006 and two additional layers. Generally, the substrate 1006 is formed from a semiconductor material. The two layers (the first layer 1004 and the second layer 1002) are formed from different electrically conductive materials and are stacked over the back surface of the substrate 1006. Multiple spaced apart pinning regions 1010 are distributed at an interface between the two layers. These pinning regions locally anchor the layers.

The photovoltaic cell 1001 is arranged to receive light at the front surface 1030 of the semiconductor substrate 1006. The light generates free electrons in the semiconductor material, which then flow through the first and second layers 1004 and 1002 as indicated by the arrows in FIG. 10C. Ideally, the first layer 1004 is formed from an electrically conductive material that adheres well to the semiconductor material. Such materials, however, are not known to be the best conductors 1004. For example, aluminum bonds well with the semiconductor substrate but conducts electricity about half as well as silver, which bonds poorly with the semiconductor substrate and aluminum.

It is desirable to use a highly conductive material for the second layer 1002, so that the electrical current can be directed quickly to the edges of the photovoltaic cell 1001, where it can be used for power generation. To help prevent delamination between the first and second layers 1004 and 1002 and maximize current flow, pinning regions 1010 are positioned along the interface between the first and second layers 1004/1002 to help bond the layers together. In various embodiments, the pinning regions 1010 are defined by pinning elements 1008 that are electrically non-conductive or are poor conductors of electricity. In such embodiments, the footprint of the pinning regions 1010 is preferably minimized so that the free electrons have easier access to the overlying, highly conductive second layer 1002. In the illustrated embodiment, for example, the centers of adjacent pinning regions 1010 are separated by a distance d, where $d<2a_m$, where $2a_m$ is based on the factors (e.g., estimated compressive forces, stiffness of the thin film layer, etc.) that were discussed earlier. Various embodiments involve a photovoltaic cell 1001 where the pinning regions occupy less than 5% of the interface between the first and second layers 1004/1002 and at least 95% of a surface of the first layer 1004 is in direct contact with a surface of the second layer 1002.

Various materials may be used for the layers and the pinning regions 1010 of the photovoltaic cell, depending on the needs of a particular application. In various embodiments, the second layer 1002 is formed from silver and the first layer 1004 is formed from aluminum. The pinning regions 1010 may be formed from electrically non-conductive or conductive materials (e.g., glass, titanium, chrome, nickel, nickel chrome alloy, etc.) The dimensions of the layers can vary widely between different implementations. By way of example, the substrate 1006 may be a semiconductor wafer or a thin film semiconductor. In some embodiments, the thickness 1032 of the substrate 1006 is approximately between 100 and 300 μm. The thicknesses 1036/1034 of the first and second layers 1004/1002 may be between approximately 5 and 35 μm, although lower and higher thicknesses are also possible for particular applications. Some implementations involve a first layer that is positioned to entirely separate the second layer from the substrate, although in other implementations, portions of the second layer may extend through the first layer to come in (direct) contact with the substrate.

The photovoltaic cell 1001 may be formed using any method and/or with any feature that was previously discussed in connection with various reflector designs. By way of example, the photovoltaic cell 1001 may be formed using any suitable technique discussed in FIG. 4A, FIGS. 5A-5C, 6A-6D, 7A-7C and 8A-8C. The pinning regions 1010 may be arranged relative to the second layer 1002, first layer 1004 and the substrate 1006 in the same manner that the pinning regions 210/310 were arranged relative to the protective layer 202/302, the reflective coating 204/304 and the substrate 206/306 in FIGS. 2A-2D and 3B-3I. In a particular embodiment, pinning elements 1008 are formed on a top surface of a first layer 1004 (e.g., similar to the way in which pinning elements 308 were formed over the reflective coating 306 in FIG. 5B). In still another embodiment, portions of the first layer 1004 are treated to form pinning regions (e.g., similar to the way in which pinning regions 310 were formed by treating selected portions of the reflective coating 304 in FIG. 8B) In yet another embodiment, pinning elements 1008 are formed that extend entirely through the first layer 904 to come in direct contact with both the second layer 1004 and the semiconductor substrate (e.g., similar to the way in which pinning regions 308 may be formed to extend through the reflective coating 304, which was discussed earlier in connection with FIGS. 6A-6D.) For the purpose of applying the methods for forming reflectors that were discussed earlier to the forming of the photovoltaic cell, insofar as the methods refer to a substrate, a reflective coating and a protective layer of a reflector, the same methods may be understood as referring to the semiconductor substrate, the first layer and the second layer of the photovoltaic cell, respectively.

To better clarify how the reflector methods may be applied in the above manner, an example method for forming a photovoltaic cell 1001 based upon the method illustrated in FIGS. 5A-5C will be described. Initially, the first layer 1004 is formed over the semiconductor substrate 1006 (i.e., similar to the way in which the reflective coating 304 is formed over the substrate 306 of FIG. 5A.) Afterward, pinning elements 1008 are formed on a surface 1038 of the first layer 904 (i.e., similar to the way in which the pinning elements 308 are formed over the reflective coating 304 of FIG. 5B.) The pinning elements 1008 extend out of the surface 1038 of the first layer 904 and may be separated by a distance d, where $d < 2a_m$, whose calculation for a given thin layer was previously discussed. The second layer 1002 is then deposited over the pinning regions 1010, which are defined by the pinning elements 1008, and the underlying first layer 1004 (i.e., similar to the way in which the protective layer is formed over the reflective coating of FIG. 5C.) The first and second layers 1004/1002 may be deposited using any of the techniques for thin film deposition that were discussed earlier.

Figure 11:
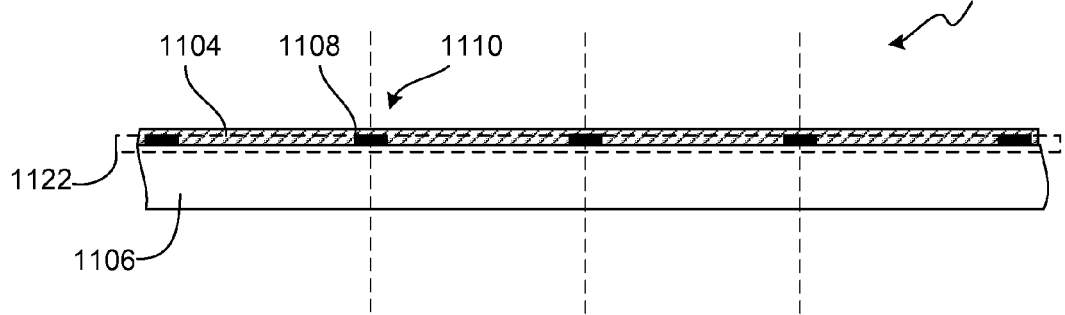
FIG. 11 is a diagrammatic side view of an optical component according to a particular embodiment of the present invention.

The idea of using small pinning regions to anchor two or more layers together may be applied to almost any type of optical component (e.g., a window, photovoltaic cell, reflector etc.) in which delamination is an issue and the transmission or reflection of light is desirable. Referring next to FIG. 11, an optical component 1101 according to a particular embodiment of the present invention will be described. FIG. 11 is a side view of the optical component 1101 that includes a substrate 1106, a thin film layer 1104 and multiple spaced apart pinning regions 1110. The pinning regions 1110 are arranged along an interface 1122 between the thin film layer 1104 and the substrate 1106 to locally anchor the thin film layer 1104 to the substrate 1106.

The composition of the layers may vary widely, depending on the needs of a particular application. In various embodiments, the substrate 1106 and the thin film layer 1104 may be made of metal, polymer, glass, thin film polymer, ceramic, a transparent material and/or an electrically conductive material. Generally, the interface 1122 between the substrate 1106 and the thin film layer 1104 is arranged to transmit or reflect electrical, optical and/or electromagnetic energy. In a particular embodiment, the optical component 1101 is a window and the substrate 1106 is transparent. In another embodiment, the thin film layer 1104 is reflective for infrared wavelengths and transmissive for visible wavelengths. Such a design is useful for windows and housing applications, where it is desirable to allow in exterior light and limit thermal losses. It is also useful for the protective cover on a solar receiver in a solar collection system (e.g., as described in U.S. Pat. No. 7,280,906, entitled "Photovoltaic Receiver," filed May 20, 2008, which was filed by the assignee of the present application and is incorporated herein by reference in its entirety for all purposes.) In various embodiments involving such a protective cover, the infrared wavelengths are often not converted into electrical energy in the receiver and they cause additional waste heat that must be removed by the receiver. Reflecting these wavelengths in the protective cover thus reduces the receiver operating temperature, which may improve receiver performance and lifetime.

The thin film layer 1004 may be formed on the substrate 1006 using any of the thin film deposition techniques discussed earlier. The pinning regions 1010 may have any feature or any arrangement previously discussed in connection with various types of reflector designs (e.g., the pinning regions may be formed on a top surface of the thin film layer, they may be arranged along the periphery of the optical component, they may be extensions of the substrate or another layer or be made of different materials, etc.) There may be additional layers (e.g., a protective layer over the thin film layer) in the optical component 1001.

Although only a few embodiments of the invention have been described in detail, it should be appreciated that the invention may be implemented in many other forms without departing from the spirit or scope of the invention. By way of example, the present invention contemplates that the features of one figure may be used to modify or rearrange the features of another figure. For example, FIG. 3A is a side view of a reflector 301 in which the reflective coating 304 is attached directly to the backside of the substrate 306. The pinning regions in FIG. 3A do not extend entirely through the reflective coating 304 and are defined by pinning elements 308 that are formed over a top surface of the protective layer 302. Other figures, however, illustrate many types of pinning elements, such as pinning elements that extend entirely through the reflective coating and pinning elements that are integral with and extend out of a surface of the protective layer and/or the substrate. The present invention therefore also contemplates various embodiments in which the pinning regions 310 illustrated in FIG. 3A have similar such features. Additionally, various parts of the present application refer to thin film deposition techniques and etching techniques. Whenever thin film deposition is referred to in connection with a particular embodiment, it should be understood that any thin film deposition technique discussed in the present application may be applied to said embodiment. Whenever etching or the removal of portions of a layer is referred to in connection with a particular embodiment, it should be understood that any etching technique discussed in the present application may be applied to said embodiment. Many of the figures are diagrammatic side views of a reflector or an optical component where the pinning regions are separated by an equal distance d. However, it should be noted that the arrangement of the pinning regions for any given embodiment may be modified based on any arrangement of pinning regions that was discussed elsewhere in the present application. By way of example, FIGS. 3G and 3H relate to pinning regions 310 that are situated at the periphery of the reflector. Other parts of the application discuss how the pinning regions are in a uniform or non-uniform arrangement. Some parts of the application described how the pinning regions may be separated by a distance d that is less than or equal to a calculated $2a_m$. In some approaches, where the arrangement of the pinning regions is non-uniform, the average distance between adjacent pinning regions may be approximately d or less than d. It should be understood that the arrangement and characteristics of pinning regions in any figure or any description in the present application may have any of the above features. Although the reflectors in the drawings are depicted as having a somewhat flat shape, the present invention also contemplates reflector layers and reflectors with a curved, substantially concave shape. In the foregoing application, there are many references to "pinning regions" and "pinning elements." Pinning elements may be understood as the structures that fill the pinning regions. In various embodiments, the pinning region is the exact space that the corresponding pinning region occupies. Accordingly, if a pinning region is described as being positioned at a certain location, the corresponding pinning element in the pining region is also positioned at that location. If the pinning region is described as containing or being filled with a particular material, then the corresponding pining element includes that material. Various drawings and descriptions in this application refer to discrete layers or elements (e.g., a first layer, a second layer, a substrate, a reflective coating, a protective layer, etc.) It should be noted that each of these layers or elements is not necessarily limited to a single layer having a uniform composition. In some implementations, a layer may contain multiple sublayers that are made of different materials. It should also be appreciated that the present application uses the terms, "substrate" and "layer" to refer to a wide variety of possible structures. For example, the term "substrate" may relate to a support substrate that physically supports other thin film layers, a transparent substrate that allows the passage of light, or any other type of layer. The term "layer" may refer to a substrate, a protective layer, a thin film reflective coating or any other type of layer. Also, the embodiments contemplated in the present application are not necessarily limited to what is shown in the figures. The figures can be modified in various ways, depending on the needs of a particular application. For example, FIGS. 10A-10B illustrate layers stacked on the back face of a semiconductor substrate; in another embodiment, however, the layers are (also) patterned and/or positioned on the front face of the semiconductor substrate. In various figures, the reflective coating is adhered directly to a substrate and/or a protective layer; in some embodiments, however, there are one or more intermediate layers between the coating and the substrate and/or the coating and the protective layer, and the pinning regions may extend into, through and/or be positioned on an intermediate layer. Therefore, the present embodiments should be considered as illustrative and not restrictive and the invention is not limited to the exact details given herein, but may be modified within the scope and equivalents of the appended claims.

What is claimed is:

1. A reflector for use in a solar collector, comprising:
a layer;
a thin film reflective coating adhered to the layer, the thin film reflective coating being positioned on and in direct contact with the layer; and
a multiplicity of spaced apart pinning regions that are distributed through an interface between the thin film reflective coating and the layer, wherein the pinning regions locally anchor the thin film reflective coating to the layer and wherein the adhesive strength of the pinning regions to the layer is greater than the adhesive strength of the thin film reflective coating to the layer.

2. A reflector as recited in claim 1, wherein the layer is selected from the group consisting of:
a substrate that supports the thin film reflective coating; and
a protective layer that protects the thin film reflective layer.

3. A reflector as recited in claim 1, wherein the pinning regions occupy less than 5% of the interface between the layer and the thin film reflective coating.

4. A reflector as recited in claim 1, wherein said layer is an intermediate layer, the reflector further comprising a substrate and a protective layer, the thin film reflective coating being sandwiched between the substrate and the protective layer, wherein the intermediate layer is at a location selected from the group consisting of 1) a location between the substrate and the thin film reflective coating and 2) a location between the protective layer and the thin film reflective coating.

5. A reflector as recited in claim 1, wherein the pinning regions are defined by adhesive pinning elements and the adhesive pinning elements are made of one selected from the group consisting of titanium, chrome, nickel, nickel chrome alloy, glass, polymer, and a material from which the layer is formed.

6. A reflector as recited in claim 1, wherein the pinning regions are defined by adhesive pinning elements and the adhesive pinning elements are deposited using one selected from the group consisting of spraying, electroplating, vapor deposition, electron beam deposition, sputtering, electroless plating, screen printing, and chemical deposition.

7. A reflector as recited in claim 1, wherein the pinning regions are formed by treating selected areas of one selected from the group consisting of the layer and the reflective coating such that the adhesive properties of the selected areas are substantially greater than in adjacent untreated areas.

8. A reflector as recited in claim 1, wherein the thin film reflective coating is made of silver and has a thickness of approximately between 20 and 200 nm.

9. A reflector as recited in claim 1, wherein the centers of the pinning regions being spaced apart by a distance d, the distance d being less than an estimated minimum size of a buckling feature in the interface when the interface lacks pinning regions.

10. A reflector as recited in claim 1, wherein adjacent pinning regions of the multiplicity of pinning regions are substantially uniformly spaced apart.

11. A reflector as recited in claim 1, wherein said layer is a protective layer and the reflector further comprises a substrate, the thin film reflective layer being sandwiched between the substrate and the protective layer, wherein the pinning regions are defined by adhesive pinning elements.

12. A reflector as recited in claim 11, wherein the pinning elements are formed on and extend out of a surface of the reflective coating, there being gaps between the pinning elements that are filled with portions of the protective layer.

13. A reflector as recited in claim 11, wherein the pinning regions are defined by elevated portions of a surface of the protective layer and wherein the elevated portions are in direct contact with the substrate.

14. A reflector as recited in claim 11, wherein the pinning regions are defined by elevated portions of a surface of the substrate and wherein the elevated portions are in direct contact with the protective layer.

15. A reflector as recited in claim 11, wherein the pinning elements extend entirely through the reflective coating and are in direct contact with the protective layer and the substrate.

16. A reflector as recited in claim 11, wherein the substrate includes a nonplanar surface with elevated regions and the reflective coating follows a profile of the substrate such that the reflective coating also includes corresponding elevated regions.

17. A reflector as recited in claim 1, wherein the pinning regions are arranged at a periphery of the reflector.

18. A reflector as recited in claim 1, wherein the pinning regions are substantially less reflective than the reflective thin film coating.

19. A reflector as recited in claim 1, wherein the spacing between the pinning regions is based at least in part on one selected from the group consisting of: 1) the stiffness of the reflective coating, the strength of adhesion between the reflective coating and the layer and an estimation of force that may be applied to the reflective coating; and 2) a minimum radius of a circular buckle $a_m$, $a_m$ being based at least partly on the following:

$$a_m = 1.106 h_f \sqrt{\frac{E_f}{|\sigma_m|}},$$

wherein $h_f$ is the thickness of a buckling layer, $E_f$ is the in-plane Young's modulus of the buckling layer, and $\sigma_m$ is the mismatch stress in the buckling layer, the buckling layer being selected from the group consisting of said layer and the thin film reflective coating.

20. A reflector for use in a solar collector, comprising:
a layer;
a thin film reflective coating adhered to the layer, the thin film reflective coating being positioned on and in direct contact with the layer; and
a pinning structure that extends continuously along the periphery of the reflector and is distributed through an interface between the thin film reflective coating and the layer, the pinning structure locally anchoring the thin film reflective coating to the layer, wherein the continuous pinning structure is arranged to help seal edge regions of the reflector and wherein the adhesive strength of the pinning structure to the layer is greater than the adhesive strength of the thin film reflective coating to the layer.

* * * * *